(12) United States Patent
Wachtler et al.

(10) Patent No.: US 11,538,717 B2
(45) Date of Patent: *Dec. 27, 2022

(54) ELECTRONIC PACKAGE FOR INTEGRATED CIRCUITS AND RELATED METHODS

(71) Applicant: Texas Instruments Incorporated, Dallas, TX (US)

(72) Inventors: Kurt Peter Wachtler, Richardson, TX (US); Anindya Poddar, Sunnyvale, CA (US); Usman Mahmood Chaudhry, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/115,730

(22) Filed: Dec. 8, 2020

(65) Prior Publication Data

US 2021/0090940 A1    Mar. 25, 2021

Related U.S. Application Data

(63) Continuation of application No. 15/823,149, filed on Nov. 27, 2017, now Pat. No. 10,861,741.

(51) Int. Cl.
*H05K 7/00* (2006.01)
*H01L 21/768* (2006.01)
(Continued)

(52) U.S. Cl.
CPC .......... *H01L 21/7682* (2013.01); *B81B 7/007* (2013.01); *H01L 21/822* (2013.01); *H01L 23/04* (2013.01); *H01L 23/315* (2013.01); *H01L 23/3121* (2013.01); *H01L 23/3135* (2013.01); *H01L 23/4985* (2013.01); *H01L 24/80* (2013.01); *H05K 1/185* (2013.01); *H01L 23/3107* (2013.01); *H01L 23/562* (2013.01); *H01L 24/32* (2013.01); *H01L 24/48* (2013.01); *H01L 24/49* (2013.01); *H01L 24/83* (2013.01); *H01L 24/85* (2013.01); *H01L 24/92* (2013.01); *H01L 2224/04042* (2013.01); *H01L 2224/05554* (2013.01); *H01L 2224/32145* (2013.01); *H01L 2224/32225* (2013.01);
(Continued)

(58) Field of Classification Search
CPC ..... H01L 23/3121; H01L 24/32; H01L 24/49; H05K 1/185
USPC ........................................................ 361/783
See application file for complete search history.

(56) References Cited

U.S. PATENT DOCUMENTS 4,814,943 A    3/1989  Okuaki
5,436,203 A    7/1995  Lin
(Continued)

FOREIGN PATENT DOCUMENTS

CN    103193198 A  *  4/2013

*Primary Examiner* — Andargie M Aychillhum
(74) *Attorney, Agent, or Firm* — Dawn Jos; Frank D. Cimino

(57) ABSTRACT

Electronic packages and related methods are disclosed. An example electronic package apparatus includes a substrate and an electronic component. A protective material is positioned on a first surface, a second surface and all side surfaces of the electronic component to encase the electronic component. An enclosure is coupled to the substrate to cover the protective material and the electronic component.

14 Claims, 14 Drawing Sheets

(51) Int. Cl.
  *H01L 23/498* (2006.01)
  *H05K 1/18* (2006.01)
  *B81B 7/00* (2006.01)
  *H01L 23/31* (2006.01)
  *H01L 21/822* (2006.01)
  *H01L 23/00* (2006.01)
  *H01L 23/04* (2006.01)

(52) U.S. Cl.
  CPC ............... *H01L 2224/32245* (2013.01); *H01L 2224/48091* (2013.01); *H01L 2224/48145* (2013.01); *H01L 2224/48227* (2013.01); *H01L 2224/48247* (2013.01); *H01L 2224/49052* (2013.01); *H01L 2224/49175* (2013.01); *H01L 2224/73265* (2013.01); *H01L 2224/83192* (2013.01); *H01L 2224/85203* (2013.01); *H01L 2224/85205* (2013.01); *H01L 2224/92247* (2013.01); *H01L 2225/06524* (2013.01); *H01L 2924/14* (2013.01); *H01L 2924/1461* (2013.01); *H01L 2924/15153* (2013.01); *H01L 2924/15313* (2013.01); *H01L 2924/181* (2013.01); *H01L 2924/19107* (2013.01); *H01L 2924/351* (2013.01); *H01L 2924/35121* (2013.01)

(56) References Cited

U.S. PATENT DOCUMENTS

| | | |
|---|---|---|
| 6,472,598 B1 | 10/2002 | Glenn |
| 6,686,649 B1 | 2/2004 | Mathews |
| 7,432,586 B2 | 10/2008 | Zhao et al. |
| 7,872,335 B2 | 1/2011 | Khan |
| 8,183,687 B2 | 5/2012 | Khan et al. |
| 8,767,411 B2 | 7/2014 | Goetz et al. |
| 9,284,182 B1* | 3/2016 | Shah ............... B81B 3/0005 |
| 9,761,543 B1 | 9/2017 | Male et al. |
| 10,201,072 B2 | 2/2019 | Kuk |
| 10,217,649 B2 | 2/2019 | Lai |
| 2001/0040280 A1 | 11/2001 | Funakura |
| 2005/0046001 A1 | 3/2005 | Warner |
| 2007/0029569 A1 | 2/2007 | Andrews |
| 2007/0290364 A1 | 12/2007 | Gupta |
| 2008/0122087 A1 | 5/2008 | Jobetto |
| 2008/0217708 A1 | 9/2008 | Reisner et al. |
| 2009/0310322 A1 | 12/2009 | Koh et al. |
| 2010/0078791 A1 | 4/2010 | Yim et al. |
| 2011/0095421 A1 | 4/2011 | Kim |
| 2011/0156178 A1 | 6/2011 | Zuniga-Ortiz et al. |
| 2012/0286405 A1 | 11/2012 | Toyota |
| 2013/0099333 A1 | 4/2013 | Zuniga-Ortiz et al. |
| 2013/0228901 A1 | 5/2013 | Dershem et al. |
| 2013/0187266 A1 | 7/2013 | Chen |
| 2013/0328141 A1 | 12/2013 | Ararao |
| 2014/0010374 A1 | 1/2014 | Kasai et al. |
| 2015/0177171 A1 | 6/2015 | Kim et al. |
| 2017/0084519 A1* | 3/2017 | Speight ............ H01L 23/49861 |
| 2017/0197823 A1 | 7/2017 | Wachtler |
| 2018/0061744 A1* | 3/2018 | Railkar ................ H01L 24/00 |
| 2018/0168029 A1 | 6/2018 | Kuk et al. |

* cited by examiner

ELECTRONIC PACKAGE FOR INTEGRATED CIRCUITS AND RELATED METHODS

This application is a continuation of U.S. patent application Ser. No. 15/823,149, filed Nov. 27, 2017, the contents of which are herein incorporated by reference in its entirety.

FIELD OF THE DISCLOSURE

This disclosure relates generally to electronic packages and, more particularly, to electronic package for integrated circuits and related methods.

BACKGROUND

Some electronic packages include semiconductor devices that are high precision, stress sensitive components or devices (e.g. microelectromechanical systems (MEMS)). Depending on the semiconductor device and/or the intended application, stresses may alter an output performance of the semiconductor device.

SUMMARY

An example electronic package apparatus includes a substrate and an electronic component. A protective material is positioned on a first surface, a second surface and all side surfaces of the electronic component to encase the electronic component. An enclosure is coupled to the substrate to cover the protective material and the electronic component.

Figure 1:
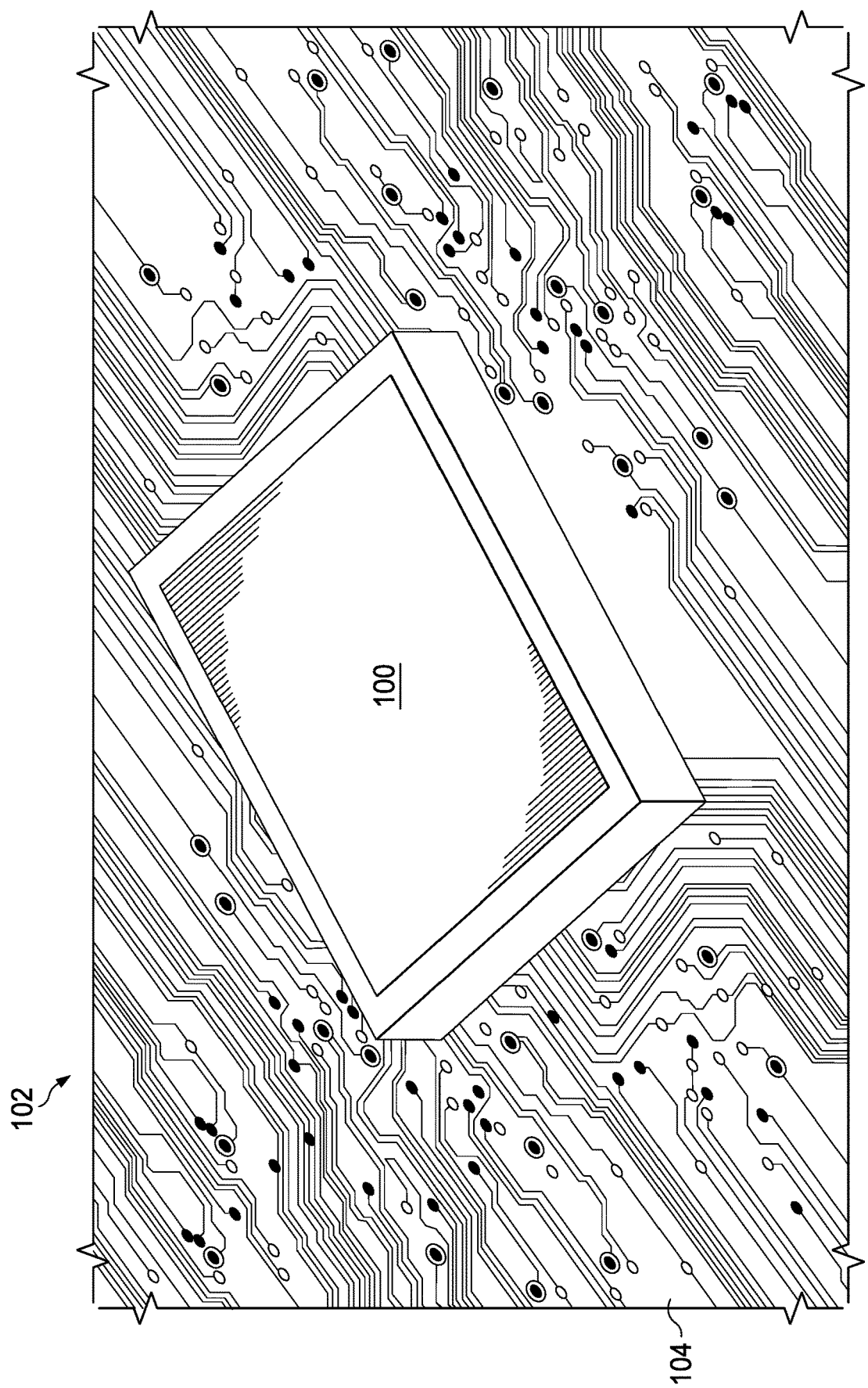
FIG. 1 is an example integrated circuit including an electronic package constructed in accordance with the teachings of this disclosure.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Electronic integrated circuits (ICs) are generally enclosed in electronic packages (e.g., plastic or ceramic packages) of a generally rectangular paralielepipedal hexahedral shape. These electronic packages include a plurality of leads to provide electrical contact to the circuits contained within an electronic package, and the leads attach to a printed circuit board that typically forms part of a larger assembly of similar integrated circuits and other electronic components.

Mechanical and/or thermal stresses may negatively affect overall performance of some electrical packages (e.g., semiconductor devices and/or microelectromechanical systems (MEMS)). For example, performance (e.g., voltage output, frequency output, etc.) of high precision, stress sensitive devices (e.g., MEMS device) of some electrical packages may degrade or reduce due to mechanical and/or thermal stresses.

For example, stresses can be imparted to stress sensitive devices (e.g., semiconductor devices, MEMS devices, etc.) of electronic packages via mold compound filler particles that apply pressure on a surface of the stress sensitive device when a mold compound is applied to the electronic package during manufacturing. In some instances, thermal stresses imparted to a stress sensitive device due to thermal expansion can bend or deform the stress sensitive device and negatively impact an overall performance of the sensitive device. Conventional methods to reduce such stresses have limited manufacturability, application specific reliability and/or have relatively high manufacturing costs.

Example electronic packages and related methods disclosed herein protect high precision components or structures (e.g., semiconductor devices) from forces (e.g., external forces) and/or stresses (e.g., mechanical stresses, thermal stresses, etc.). In some instances, example electronic packages (e.g., semiconductor devices) and/or related methods of forming electronic packaging disclosed herein isolate high precision and/or fragile components or structures from mechanical and/or thermal stresses.

To protect high precision components or structures from stresses or forces (e.g., mechanical and/or thermal stresses), example electronic packages and related methods disclosed herein employ a protective material or layer that encases or surrounds (e.g., completely surrounds all sides or surfaces of) a high precision, stress sensitive device. Example protective materials disclosed herein may be composed of material(s) having low modulus of elasticity characteristic(s) or properties (e.g., a relatively low Young's modulus). For example, example protective materials disclosed herein may be material(s) having relatively flexible or elastic characteristic(s) or properties. In some examples, the protective layer or material may be silicone (e.g., having a modulus of elasticity of less than 10 megapascals (MPa)) and/or any other material(s) having low modulus of elasticity. In some instances, example high precision, stress sensitive components or structures of electronic packages disclosed herein are fully enclosed, fully encased, fully surrounded, and/or otherwise positioned inside the protective layer. For example, the protective material encases top, bottom, left, right, rear and front surfaces (e.g., all surfaces) of a stress sensitive device. In other words, the protective layer provides a three-dimensional protective layer (e.g., three-dimensional isolation protection) that surrounds all sides (e.g., six sides of a rectangular or square shaped component) of the stress-sensitive device. In some instances, example electronic packages and related methods disclosed herein mechanically isolate a die of electronic package from all external and/or internal stresses. In some examples, the protective material or layer dissipates or absorbs forces imparted to the protective layer or material to prevent or reduce such forces from affecting or impacting the electronic component.

Additionally, to further isolate and/or reduce (e.g., minimize) mechanical and/or thermal stresses from transferring to the high precision, stress sensitive components or structures, example electronic packages disclosed herein include an air gap formed between the protective layer (e.g., a low modulus of elasticity material(s)) and an enclosure of the example electronic packages. The air gap disclosed herein may mechanically decouple the high precision, stress sensitive devices from the enclosure. The air gap is formed during manufacturing of the electronic package. The air gap may be, for example, between 0.25 millimeters and 15 millimeters. To form the gap, the electronic packages disclosed herein employ a protective material (e.g., silicone rubber) having a thermal expansion rate characteristic(s) (e.g., between 275 and 350 parts per million per degree Celsius) that is different from (e.g., greater than) a thermal rate of expansion characteristic(s) (e.g., 20 parts per million per degree Celsius) of an enclosure material (e.g., a mold compound or plastic resin) employed to form an outer enclosure (e.g., a cap). In this manner, the protective material may shrink at a faster rate than mold material of the outer enclosure during a cooling process.

To control or contain the protective material and/or layer relative to a substrate, example electronic packages disclosed herein employ a containment material or layer. For example, the containment material enables controlled containment of the protective material (e.g., a silicone material) to a designed area. In some examples, the containment material or layer helps prevent or control (e.g., significantly reduces) delamination of an electronic component (e.g., a die) from a base or substrate (e.g., a PCB). Delamination of a die from substrate may occur due to voids or other defects in an attachment material (e.g., a die-attach material) between the substrate and the die. In some examples, the protective material or layer disclosed herein attaches or couples an electronic component to a substrate via the containment material.

FIG. 1 is a perspective view of an example electronic package 100 constructed in accordance with the teachings of this disclosure. The electronic package 100 of the illustrated example may be used with an integrated circuit (IC) 102. The electronic package 100 of the illustrated example is a semiconductor package that includes electronic components (e.g., semiconductor devices). For example, the electronic package 100 may include stress sensitive devices (e.g., semiconductor devices, microelectromechanical systems MEMS)) that may provide degraded or inferior output performance when subjected to forces or stresses (e.g., mechanical and/or thermal stresses) compared to an output performance of the stress sensitive device when the stress sensitive device is not subjected to the forces or stresses. For example, the electronic package 100 may implement a bulk acoustic wave (BAW) device (e.g., a BAW filter), a jitter control device, a voltage control device, a frequency control device, and/or any other device(s).

The electronic package of the illustrated example is coupled to a printed circuit board 104 of the IC 102 via, for example, soldering. The electronic package 100 includes a plurality of leads to provide electrical contact to the circuits within the electronic package 100, and the leads include a means for attachment to the printed circuit board 104 that typically forms part of a larger assembly of similar electronic packages or integrated circuits and/or other electronic components.

Figure 2A:
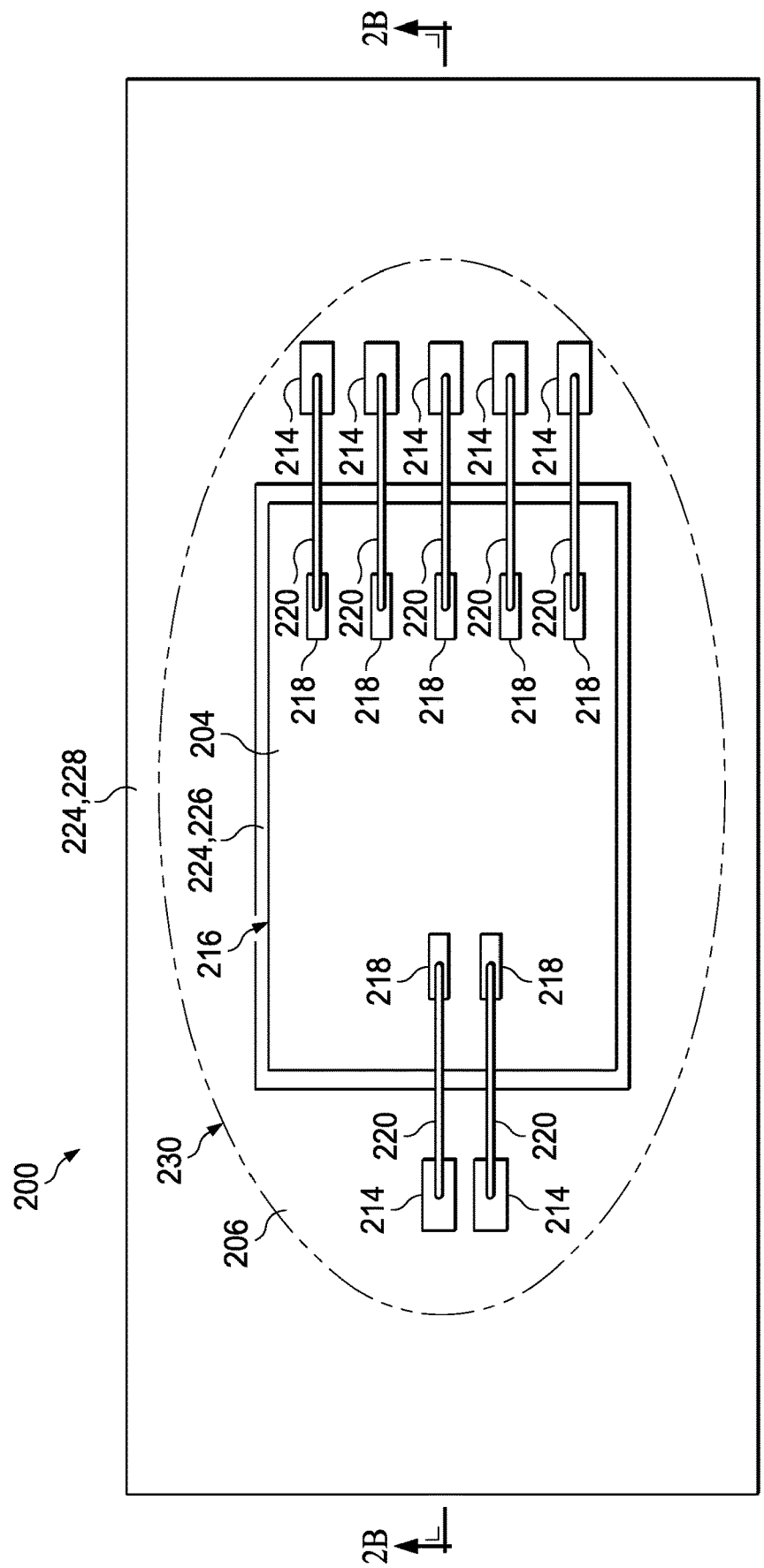
FIG. 2A is a top, partial view of an example electronic package disclosed herein.
Figure 2B:
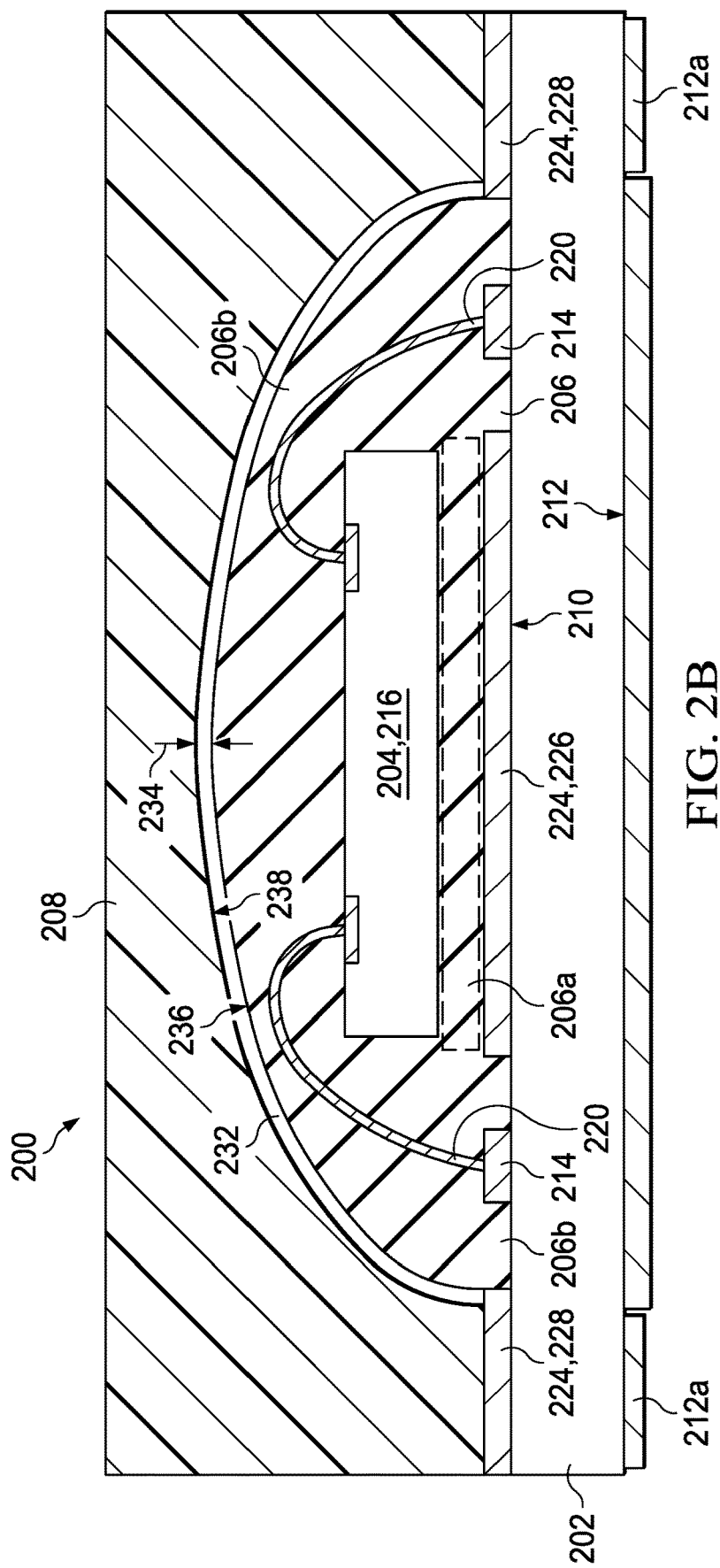
FIG. 2B is a cross-sectional view of the example electronic package of FIG. 2A taken along line 2B-2B of FIG. 2A.

FIG. 2A is a partial, top view of an example electronic package 200 disclosed herein that may implement the electronic package 100 of FIG. 1. FIG. 2B is a cross-sectional view of the example electronic package 200 of FIG. 2A taken along line 2A-2A of FIG. 2A. Referring to FIG. 2A and FIG. 2B, the electronic package 200 of the illustrated example includes a substrate 202, an electronic component 204, a protective material 206 (e.g., a layer), and an enclosure 208. The enclosure 208 is not shown in FIG. 2A for clarity.

The substrate 202 of the illustrated example has a first side 210 and a second side 212 opposite the first side 210. The first side 210 of the illustrated example receives the electronic component 204, the protective material 206, and the enclosure 208. The second side 212 of the example substrate 202 of the illustrated example may include solder mask 212a. To electrically couple the electronic component 204 of the electronic package 200 to another electrical component (e.g., circuit board), the substrate 202 of the illustrated example has one or more electrical traces and/or electrical conductive pads 214 (e.g., copper leads). In some examples, the substrate 202 of the illustrated example may be a circuit board (e.g., a printed circuit board (PCB)). In some examples, the substrate 202 of the illustrated example may be a support base composed of, for example, silicon (Si), and/or any other suitable material(s).

The electronic component 204 of the illustrated example is a die 216. The die 216 of the illustrated example is a high precision, stress sensitive device. In other words, the die 216 of the illustrated example is sensitive to mechanical and/or thermal stresses or forces. To this end, a performance characteristic (e.g., voltage output) of the die 216 of the illustrated example may degrade if subjected to stresses (e.g., thermal and/or mechanical stresses). The die 216 of the illustrated example includes conductive pads 218, which are electrically coupled to the conductive pads 214 of the substrate 202 via wires 220.

The die 216 of the illustrated example may be a microelectromechanical device (MEMS device), a semiconductor device, a diode, a transistor, an analog device, a digital device and/or any other semiconductor device(s). In some examples, the die 216 may be a microelectromechanical device to implement a Bluetooth device and/or a clock. In some examples, the die 216 may implement a jitter control circuit. In some examples, the microelectromechanical device may include a movable or bendable piezoelectric layer that is sensitive to mechanical and/or thermal stresses or forces. In some examples, the die 216 may implement an inertial sensor, an accelerometer, a gyroscope, cantilever devices (e.g., resonators, force sensors, atomic force probes, etc.), precision stress and temperature isolation MEMs, and/or any other electronic device(s).

To protect the electronic component 204 (e.g., the die 216) from thermal and/or mechanical stresses (e.g., during manufacturing processes, when in use or otherwise), the electronic package 200 of the illustrated example includes the protective material 206 (e.g., a glob of material). The protective material 206 of the illustrated example is deposited or positioned (e.g., selectively deposited) on the electronic component 204. For example, the protective material 206 may be deposited on the electronic component 204 via a dispenser, a nozzle, a syringe, and/or any other manufacturing processes (e.g., semiconductor manufacturing technique(s)).

The protective material 206 of the illustrated example is a material having a relatively low Young's modulus of elasticity. For example, the protective material 206 of the illustrated example has elastic properties and/or characteristics. For example, the protective material 206 of the illustrated example may be a rubber material and/or any other suitable elastomeric material. In some examples, the protective material 206 of the illustrated example may be a material having Young's modulus of elasticity values of between 2 megapascal (MPa) and 6 megapascal (MPa). In some examples, the protective material 206 of the illustrated example may be silicone (e.g., a silicone rubber having a Young's Modulus of elasticity of 5 MPa). In some examples, the protective material 206 may include additives and/or other materials such as, for example, adhesive and/or any other boding agent(s).

The properties and/or characteristics of the protective material 206 protect (e.g. isolate) the electronic components 204 (e.g., the die 216) from thermal and/or mechanical stresses. In some examples, the protective material 206 absorbs and/or dissipates forces generated by stresses.

To protect the die 216 from thermal and/or mechanical stresses, the die 216 of the illustrated example are encased by the protective material 206. For example, in the illustrated example, the protective material 206 (e.g., completely or fully) surrounds the electronic component 204. In other words, the protective material 206 of the illustrated example encases or encapsulates (e.g., all sides or surfaces of) the electronic components 204 of the electronic package 100. Stated differently, the protective material 206 is positioned on a first or upper surface, a second or bottom surface, and around all side surfaces of the die 216. Thus, the protective material 206 of the illustrated example forms a bubble and/or dome like-structure (e.g., a glob) and the electronic components 204 of the illustrated example are positioned inside the bubble or dome like-structure formed by the protective material 206. For example, the protective material 206 forms a three-dimensional sphere or a three-dimensional containment apparatus.

A dispensing pattern of the protective material 206 and/or rheological material characteristics of the protective material 206 enables the protective material 206 to form or maintain a sphere or dome-like shape. In other words, the second layer 206b of the protective material 206 maintains or supports a dome-like shape when dispensed onto the substrate 202 due to the material properties or characteristics (e.g., rheological properties) and/or a pattern in which the second layer 206b of the protective material 206 is dispensed on the substrate 202 (e.g., via a nozzle). For example, the second layer 206b of the protective material 206 may be dispensed on the substrate 202 in a circular pattern of decreasing diameter as a height of the second layer 206b increases to form the dome-like structure. Additionally, to protect the wires 220 from damage (e.g., from the enclosure 208), the protective material 206 of the illustrated example also covers portions or encases or encapsulates the wires 220. The conductive pads 214 and 218 are also contained within the protective material 206.

Although the protective material 206 protects (e.g., isolates) the electronic component 204 from mechanical and/or thermal stresses, the protective material 206 of the illustrated example has viscous characteristic(s) and/or properties that make it difficult to maintain and/or control when applied or dispensed onto the substrate 202 during manufacturing. For example, the protective material 206 is formed from a material(s) having relatively low viscous characteristic(s) or properties and, therefore, is prone to flow (e.g., bleed out) to undesired areas of the substrate 202 when the protective material 206 is deposited or dispensed on the substrate 202 during manufacturing. In some instances, failing to contain the protective material 206 may cause voids in the protective material that can cause the die 216 to delaminate from the protective material 206.

To contain the protective material 206 during manufacturing and/or control delamination, the electronic package 100 of the illustrated example employs a containment mask 224. The containment mask 224 of the illustrated example has hydrophobic characteristic(s) or properties. In some examples, the containment mask 224 may include adhesive characteristic(s) or properties in addition to having hydrophobic characteristic(s). In some examples, a layer of adhesive (e.g., epoxy) may be positioned on and/or mixed with the containment mask 224.

The containment mask 224 of the illustrated example is a hydrophobic material that contains or controls the flow of the material of the protective material 206 on the substrate 202 when the material forming the protective material 206 is dispensed on the substrate 202 during manufacturing. The containment mask 224 of the illustrated example may be an epoxy based polymer material, a polyimide, a polyamide, a bismaleimide (BMI) resin or material(s), a polyamide-imide polymer, a hydrophobic polyimide, a hydrophobic coating, etc. The containment mask 224 of the illustrated example may be dispensed on the substrate 202 via a dispenser (e.g., a nozzle), a syringe, an ink jet printer, and/or any other manufacturing technique(s) (e.g., semiconductor manufacturing technique(s)).

To control and/or contain the protective material 206 positioned underneath the die 216, the electronic package 200 of the illustrated example includes a first containment mask 226. The first containment mask 226 of the illustrated example is positioned on the first side 210 of the substrate 202 underneath the die 216. For example, the first containment mask 226 is provided on a first portion of the substrate 202. After the first containment mask 226 is positioned on the substrate 202, a first layer 206a of the protective material 206 is dispensed or provided on the first containment mask 226. The die 216 is then positioned on the first layer 206a of the protective material 206, which is contained within (e.g., does not bleed or flow outside) a perimeter of the first containment mask 226 due to the hydrophobic characteristic(s) of the first containment mask 226. In the illustrated example, a surface of the die 216 oriented toward first layer 206a of the protective material 206 (e.g., a bottom surface of the die 216 in the orientation of FIG. 2B) is positioned on the first layer 206a. In some examples, the first containment mask 226 has a shape and/or area that is similar (e.g., identical, slightly greater) to a shape and/or area of the die 216. For example, the first containment mask 226 may have a rectangular shape, a circular shape, an elliptical shape and/or any other shape corresponding to an area on which the protective material 206 is to be positioned on the substrate 202. A size or shape of the first containment mask 226 of the illustrated example may be slightly oversized relative to a size of the die 216 such that an area or perimeter of the first containment mask 226 is greater than an area or perimeter of the die 216. In some examples, an area or perimeter of the first containment mask 226 may be less than or identical to an area or perimeter of the die 216.

After the die 216 is positioned on the first layer 206a of the protective material 206 contained by the first containment mask 226, the wires 220 are attached to the conductive pads 218 of the die 216 and the conductive pad 214 of the substrate 202. In the illustrated example, the wires 220 are attached via conventional wire bonding processes.

A second layer 206b of the protective material 206 is then disposed on the electronic component 204 (e.g., the die 216). The second layer 206b of the illustrated example is a glob of material. In some examples, the first and second layers 206a and 206b of the protective material 206 form a continuous layer of protective material 206. For purposes of explanation, the first layer 206a of the protective material 206 is shown in dashed lines in the figures to distinguish between the first layer 206a and the second layer 206b of the protective material 206. To contain the second layer 206b of the protective material 206 from flowing (e.g., bleeding out) beyond a desired area (e.g., a perimeter) during manufacturing, the electronic package 200 of the illustrated example employs a second containment mask 228. For example, the second layer 206b of the protective material 206 may be positioned on a second portion of the substrate 202 different than the first portion (e.g., on which the first containment mask 226 is positioned). The second containment mask 228 of the illustrated example defines a perimeter 230 around of the electronic component 204. In the illustrated example, the second containment mask 228 is provided at a distance from an outermost perimeter of the die 216. In other words, the second containment mask 228 fully surrounds (e.g., provides a 360-degree wall around) the die 216. The second containment mask 228 of the illustrated example covers (e.g., an entire surface of) the first side 210 of the substrate 202 outside of the perimeter 230. However, in some examples, the second containment mask 228 may be formed as a ring surrounding the perimeter 230 (e.g., as shown, for example, in FIGS. 4-8 below).

Thus, the first containment mask 226 and the second containment mask 228 of the illustrated example contain the protective material 206 to prevent the protective material 206 from flowing (e.g., bleeding out) beyond or outside a perimeter defined by the first and second containment masks 226, 228 when the protective material 206 is applied or dispensed onto the substrate 202 during manufacturing of the electronic package 200. For example, the hydrophobic characteristics of the first and second containment masks 226, 228 prevent the protective material 206 from flowing outwardly.

The protective material 206 (e.g., the first and second layers 206a and/or 206b) attach the die 216 to the substrate 202. As a result of containing the protective material 206, the first containment mask 226 and/or the second containment mask 228 helps prevent or control delamination of the die 216 from substrate 202. In other words, the first containment mask 226 and/or the second containment mask 228 help prevent voids or other defects in the protective material 206 between the substrate and the die 216.

Furthermore, in some examples, surrounding or encasing (e.g., all surfaces and/or sides of) the electronic components 204 (e.g., the die 216) with the protective material 206 reduces (e.g., eliminates) die size constraints. For example, conventional packages require a minimum die height or thickness of 2 mm. Employing the protective material 206 of the illustrated example enables use of a die having a thickness of less than 2 mm.

To cover or encapsulate (e.g., enclose) the electronic component 204 (e.g., the die 216), the electronic package 200 of the illustrated example includes the enclosure 208. The enclosure 208 of the illustrated example is formed using a mold compound (e.g., a plastic resin) that is applied to the substrate via, for example, injection molding. Although the second containment mask 228 of the illustrated example has hydrophobic characteristic(s) or properties, the second containment mask 228 enables (e.g., enhances) attachment of the mold compound (e.g., plastic material, resin material) to the substrate 202. In other words, although the second containment mask 228 includes hydrophobic characteristic(s) or properties to prevent the flow of the protective material 206 beyond an area provided by the second containment mask 228, the second containment mask 228 includes adhesive characteristic(s) or properties to enable the mold compound to adhere or attach to the substrate 202 when the mold compound is dispensed on the substrate 202 (e.g., via injection molding manufacturing technique(s) or processes). During manufacturing (e.g., after the mold compound is dispensed on the substrate 202), the mold compound is cooled to provide the enclosure 208. Specifically, the mold compound is injected onto the protective material 206 and second containment mask 228. When the mold compound is injected onto the protective material 206 and the substrate 202, the mold compound forms a cavity or profile that is similar to the shape of the protective material 206 (e.g., the second layer 206b) to form the enclosure 208, the enclosure 208 of the illustrated example forms a cavity 232.

To further protect the electronic component 204 from mechanical and/or thermal stresses, the electronic package 200 of the illustrated example includes an air gap 234 between the protective material 206 and the enclosure 208. Specifically, the air gap 234 is formed between an outer surface 236 of the protective material 206 and an inner surface 238 of the enclosure 208 during manufacturing of the electronic package 200. For example, the air gap 234 is formed during a cooling process after the mold compound is attached to the substrate 202 to form the enclosure 208. In this manner, the electronic component 204 (e.g., the die 216) is mechanically isolated or decoupled from stresses imparted on the electronic package 200. The air gap 234 of the illustrated example may be approximately between 1 millimeter and 10 millimeters.

FIGS. 3A, 3B, and 4-8 illustrates other example electronic packages 300, 400, 500, 600, 700 and 800 disclosed herein, respectively. Those components of the example electronic packages 300, 400, 500, 600, 700 and 800 that are substantially similar and are include functions that are substantially similar structure of the electronic package 200 of FIG. 2 described above and have functions substantially similar or identical to the functions of those components will not be described in detail again below. Instead, the interested reader is referred to the above corresponding descriptions. To facilitate this process, similar reference numbers will be used for like structures.

Figure 3A:
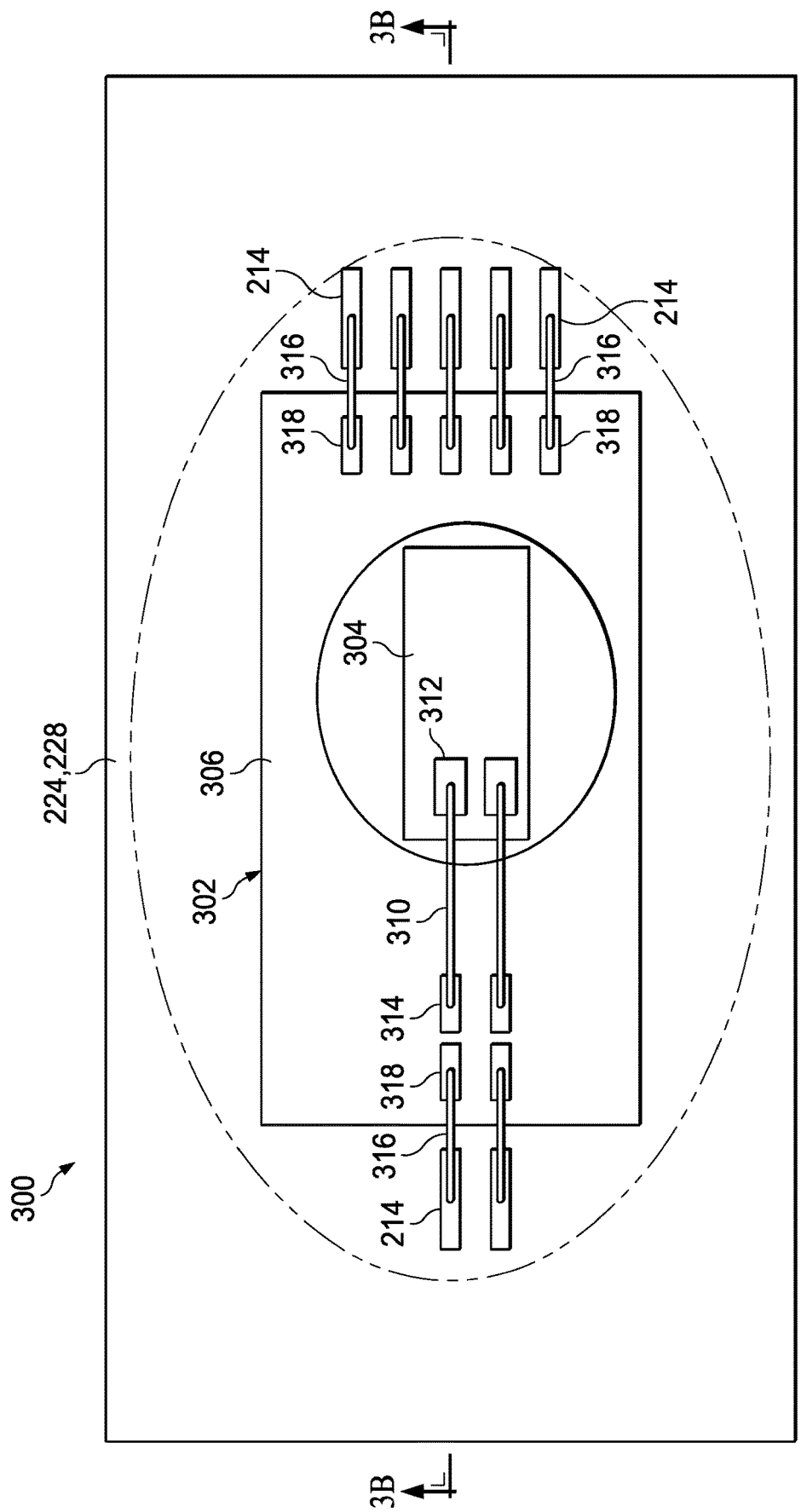
FIG. 3A is a top, partial view of another example electronic package disclosed herein.
Figure 3B:
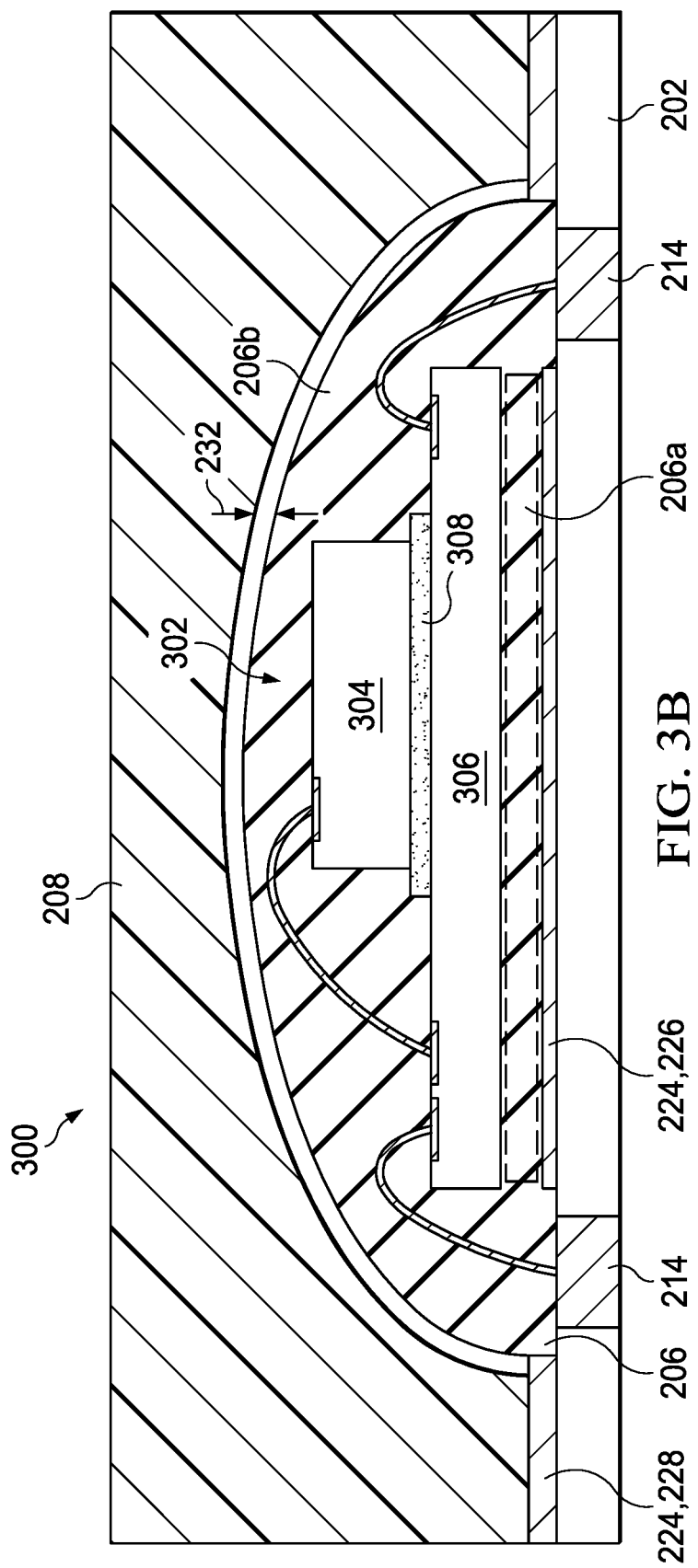
FIG. 3B is a cross-sectional view of the example electronic package of FIG. 3A taken along line 3B-3B of FIG. 3A.

Referring to FIGS. 3A and 3B, the electronic package 300 of the illustrated example is substantially similar to the electronic package 200 of FIGS. 2A and 2B. For example, the electronic package 300 of FIGS. 3A and 3B include the substrate 202, the protective material 206, the air gap 234, the enclosure 208, the containment mask 224 (e.g., the first containment mask 226 and the second containment mask 228). However, the electronic package 300 of FIGS. 3A and 3B includes electronic components 302 having a first die 304 and a second die 306. The enclosure 208 is removed from FIG. 3A for clarity. FIG. 3B is a cross-sectional view of the example electronic package 300 taken along line 3A-3A of FIG. 3A.

The first die 304 of the illustrated example is a high precision, stress sensitive device. In other words, the first die 304 of the illustrated example is sensitive to mechanical and/or thermal stresses or forces. To this end, a performance characteristic (e.g., voltage output) of the first die 304 of the illustrated example may degrade if subjected to stresses. The second die 306 of the illustrated example may not be sensitive to stresses (e.g., mechanical and/or thermal stresses). The second die 306 of the illustrated example may be a transistor, a diode, an analog device, a digital device and/or any other semiconductor or microelectromechanical device(s). For example, the first die 304 and the second die 306 may implement a jitter control device(s) or electronic package.

The first die 304 and the second die 306 of the illustrated example are positioned in a stacked configuration on the substrate 202. In other words, the first die 304 is positioned (e.g., stacked) on the second die 306. To couple the first die 304 and the second die 306, the electronic package 300 of the illustrated example includes a die-attach layer 308. The die-attach layer 308 of the illustrated example is positioned between the first die 304 and the second die 306. The die-attach layer 308 of the illustrated example may be an epoxy (e.g., adhesive), eutectic solder alloy, and/or any other adhesive or bonding agent to attach the first die 304 and the second die 306. One or more wires 310 electrically couple electrical pads 312 of the first die 304 and electrical pads 314 of the second die 306, and one or more wires 316 electrically couple the electrical pads 318 of the second die 306 and the conductive pads 214 of the substrate 202.

The protective material 206 of the illustrated example surrounds or encases entirely the electronic components 302. In other words, the protective material 206 of the illustrated example surrounds or encases the first die 304 and the second die 306. The first and second containment masks 226, 228 contain the protective material 206 from spreading to unwanted or undesired areas of the substrate 202 during manufacturing. As noted above, the air gap 234 is provided between the enclosure 208 and the protective material 206 when the electronic package 300 cools down after the mold compound is dispensed on the substrate 202 to form the enclosure 208.

Figure 4:
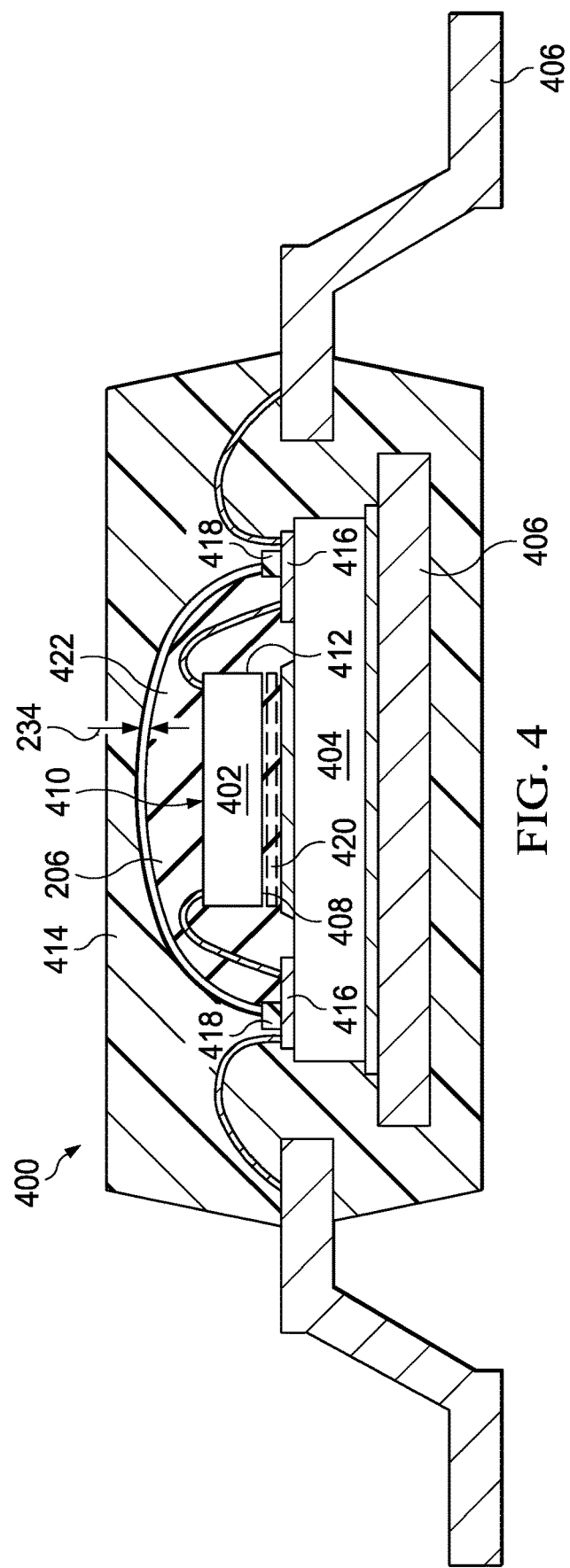
FIG. 4 is a cross-sectional view of another example electronic package disclosed herein.

Referring to FIG. 4, the electronic package 400 of the illustrated example includes an electronic component 402 (e.g., a semiconductor device, a precision integrated circuit, etc.) positioned on an interposer 404 that is positioned on a lead frame 406. The interposer 404 is a nonfunctional device that may structurally supports the electronic component 402. The interposer 404 of the illustrated example may composed of a silicon material, a laminate material and/or any other material(s). Similar to the electronic packages 200 and 300 noted above, to protect the electronic component 402, the electronic package 400 of the illustrated example includes a protective material 206. The protective material 206 surrounds (e.g., engulfs, completely surrounds) the electronic component 402. For example, the protective material 206 is positioned around a first or bottom 408 surface of the electronic component 402, on a top surface 410 of the electronic component 402, and on the side surfaces 412 of the electronic component 402. An enclosure 414 (e.g., formed via mold compound and injection molding) encloses the interposer 404, the protective material 206, and the electronic component 402. Additionally, an air gap 234 is formed between the protective material 206 and the enclosure 414. In the illustrated example, the interposer 404 supports contact pads 416.

To contain the protective material 206 from flowing outside a desired area during manufacturing (e.g., escaping from an outermost edge of the interposer 404), the electronic package 400 of the illustrated example includes a containment ring 418. The containment ring 418 of the illustrated example is formed or positioned (e.g., dispensed) on the interposer 404 surrounding the electronic component 402. The containment ring 418 of the illustrated example completely surrounds or encircles the electronic component 402. For example, the containment ring 418 forms an annular wall (e.g., in a shape of a circle, a square, etc.) around the electronic component 402. The wall formed by the containment ring 418 of the illustrated example has substantially planer or straight vertical sides. However, in some examples, the walls of the containment ring 418 (e.g., an inner vertical wall oriented towards the electronic component 402) may be angled, canted or sloped (e.g., a top portion of the side wall may be sloped or angled) toward the electronic component 402. The containment ring 418 of the illustrated example has a rectangular cross-sectional shape. However, in some examples, the containment ring 418 may have any other cross-sectional shape or profile (e.g., arcuate, triangular, sloped, etc.). The containment ring 418 of the illustrated example may be formed on (e.g., a first or upper surface of) the interposer 404 and/or may be formed on (e.g., a first or upper surface of) the contact pads 416.

During manufacturing, a first layer 420 of the protective material 206 is dispensed (e.g., directly coupled or positioned) on the interposer 404 (e.g., without the need of a containment mask such as, for example, the first containment mask 226 of FIG. 2B). After the first layer 420 of the protective material 206 is positioned or coupled to the interposer 404, the electronic component 402 is positioned on the first layer 420. After the electronic component 402 is coupled to the first layer 420 of the protective material 206, a second layer 422 (e.g., a glob top) of the protective material 206 is dispensed or positioned on or over the electronic component 402 and the interposer 404. The containment ring 418 contains the second layer 422 from flowing outside a desired area during manufacturing (e.g., escaping from an outermost edge of the interposer 404).

Figure 5:
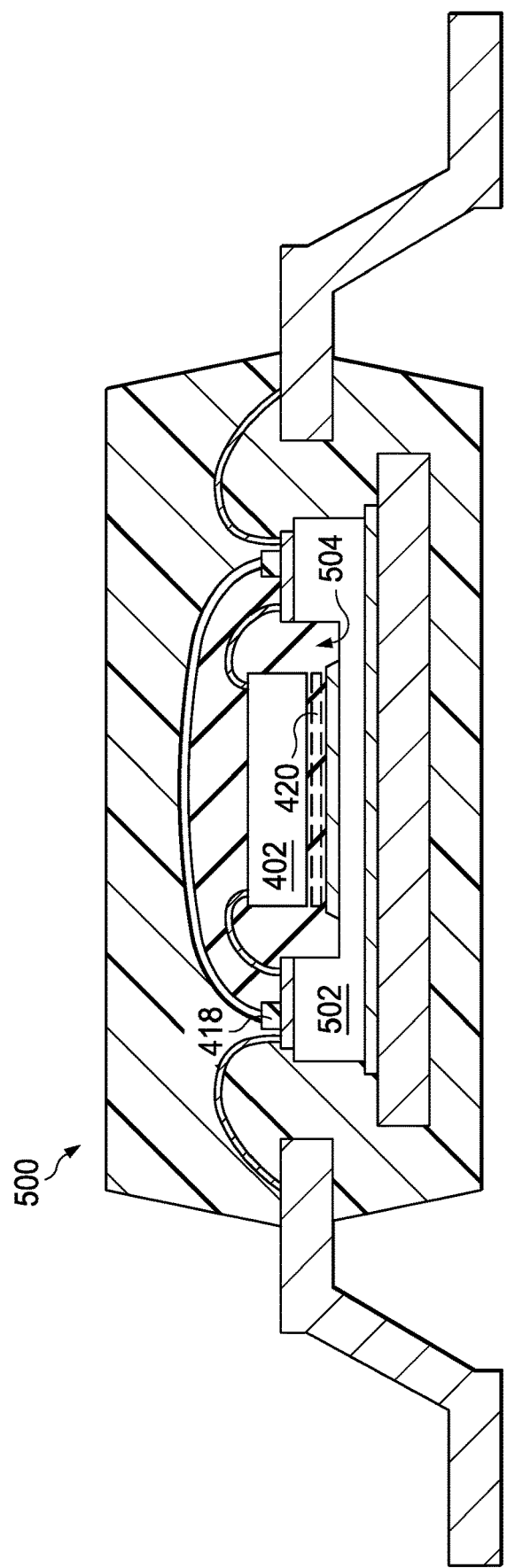
FIG. 5 is a cross-sectional view of yet another example electronic package disclosed herein.

Referring to FIG. 5, the electronic package 500 of the illustrated example similar to the example electronic package 400 of FIG. 4. However, an interposer 502 of the illustrated example includes a cavity 504 to receive at least a portion of the electronic component 402 and the protective material 206. The cavity 504 formed in the interposer 502 of the illustrated example helps the containment ring 418 contain (e.g., reduces bleed out of) the protective material 206 (e.g., the first layer 420 and/or the second layer 422) during manufacturing. For example, the cavity 504 of the interposer 502 (along with the containment ring 418) helps maintain the protective material 206 within a defined area of the interposer 502 when the protective material 206 is dispensed on the interposer 502 and/or the electronic component 402.

Figure 6:
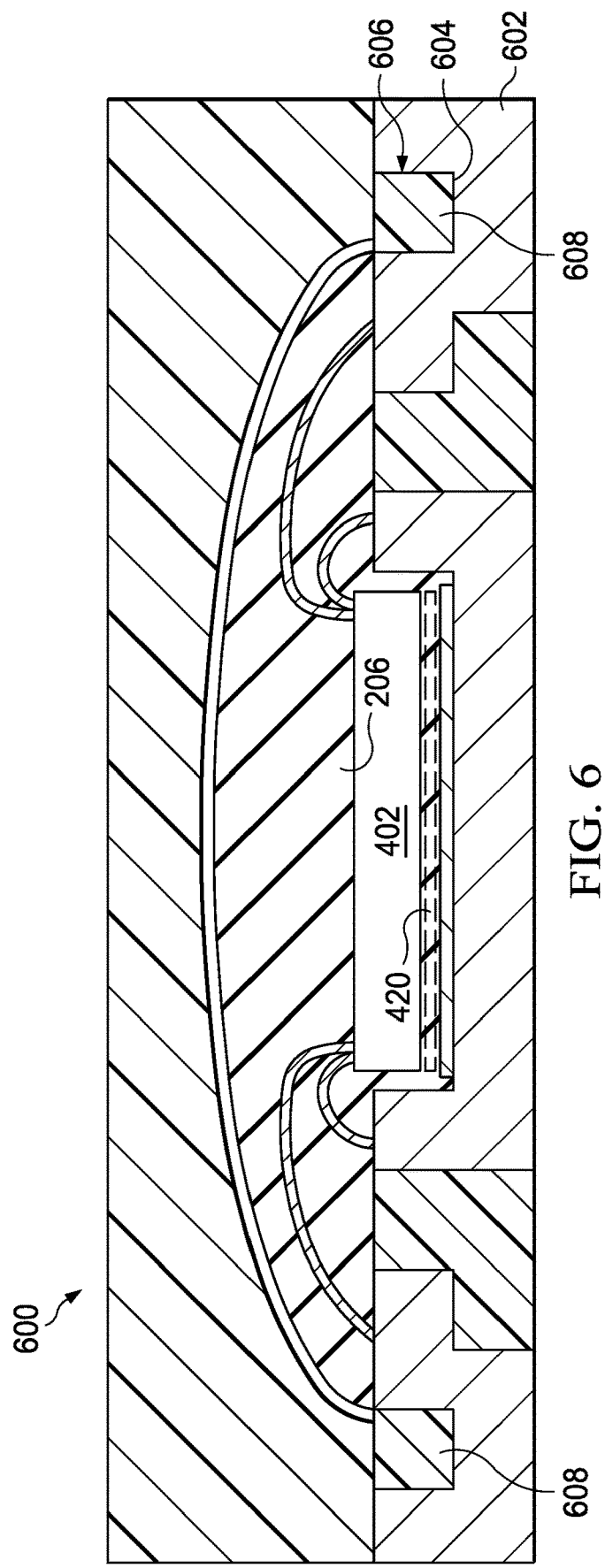
FIG. 6 is a cross-sectional view of yet another example electronic package disclosed herein.

Referring to FIG. 6, the electronic package 600 of the illustrated example includes an electronic component 402 encased or surrounded by a protective material 206. However, the electronic package 500 of the illustrated example includes a pre-molded lead frame 602. For example, the pre-molded lead frame 602 includes an etched portion 604 (e.g., a cavity, a trench, a channel, etc.) that is filled with a material 606 that defines a containment ring 608. The containment ring 608 of the illustrated example defines an area or perimeter of the protective material 206 by providing a barrier to stop the flow of the protective material 206 during manufacturing. Thus, the containment ring 608 of the illustrated example provided by the etched portion 604 surrounds (e.g., completely surrounds) the electronic component 402 and contains the protective material 206 during manufacturing such that the protective layer material does not flow (e.g., escape) outside a perimeter defined by the containment ring 608.

In some examples, the material 606 may have hydrophobic characteristic(s). In some examples, the material 606 may be coated with a material having hydrophobic characteristic(s). In some examples, the material 606 of the illustrated example may be a mold compound filler material, an epoxy based polymer material, a plastic material, a polyimide, a polyamide, a bismaleimide (BMI) resin or material(s), a polyamide-imide polymer, a hydrophobic polyimide, a hydrophobic coating, and/or any combination thereof and/or any other material(s) to contain the flow of the protective layer material during manufacturing.

Figure 7:
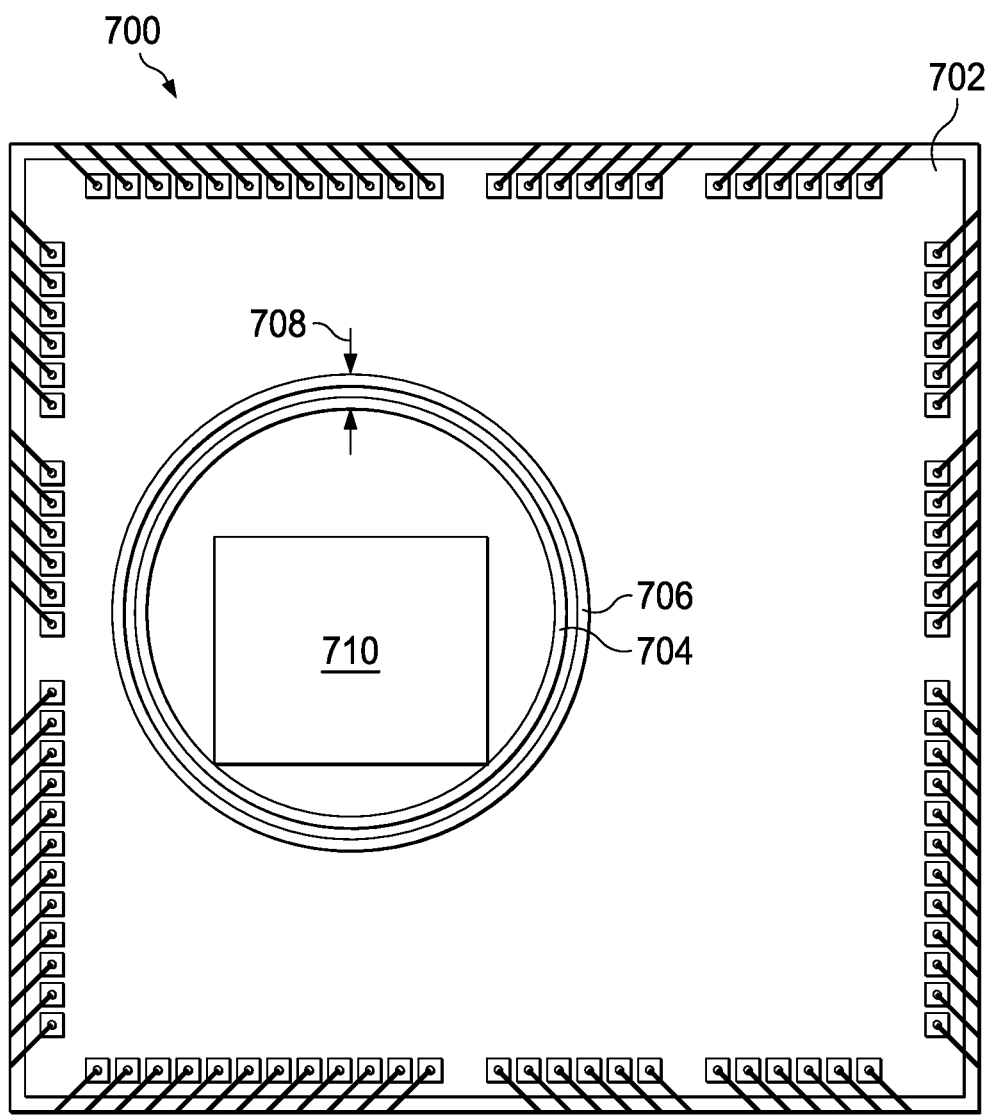
FIG. 7 is a top view of yet another example electronic package disclosed herein.

FIG. 7 is a top view of another example electronic package 700 disclosed herein. Referring to FIG. 7, the electronic package 700 includes a substrate 702 having a first containment ring 704 and a second containment ring 706 spaced from the first containment ring 704 (e.g., a dual containment ring configuration). More specifically, the first containment ring 704 is positioned inside or within the second containment ring 706. In other words, the second containment ring 706 surrounds or encircles the first containment ring 704. A gap 708 is formed or provided between the first containment ring 704 and the second containment ring 706. The first containment ring 704 and the second containment ring 706 of the illustrated example have a circular shape or pattern. However, in some examples, the first containment ring 704 and/or the second containment ring 706 may be formed as a square and/or any other shape, profile or pattern.

A containment mask 710 (e.g., the containment mask 224 of FIG. 2A) is provided on the substrate 702 to receive a protective layer material (e.g., the protective material 206) and the electronic component (e.g., the electronic component 204 or 402). An electronic component is positioned on the protective layer material that is disposed on the containment mask 710. The electronic component is to be positioned within and/or surrounded by the first containment ring 704. The protective layer material is to surround (e.g., all surfaces or the entire) electronic component when the protective layer material is positioned or dispensed on the containment mask 710 during manufacturing. The first containment ring 704 of the illustrated example prevents or restricts the flow of the protective layer material from flowing toward the second containment ring 706 during manufacturing. The second containment ring 706 provides a back-up and/or prevents or restricts any protective layer material, which may have bled past the first containment ring 704, from flowing beyond an outer perimeter defined by the second containment ring 706.

Figure 8:
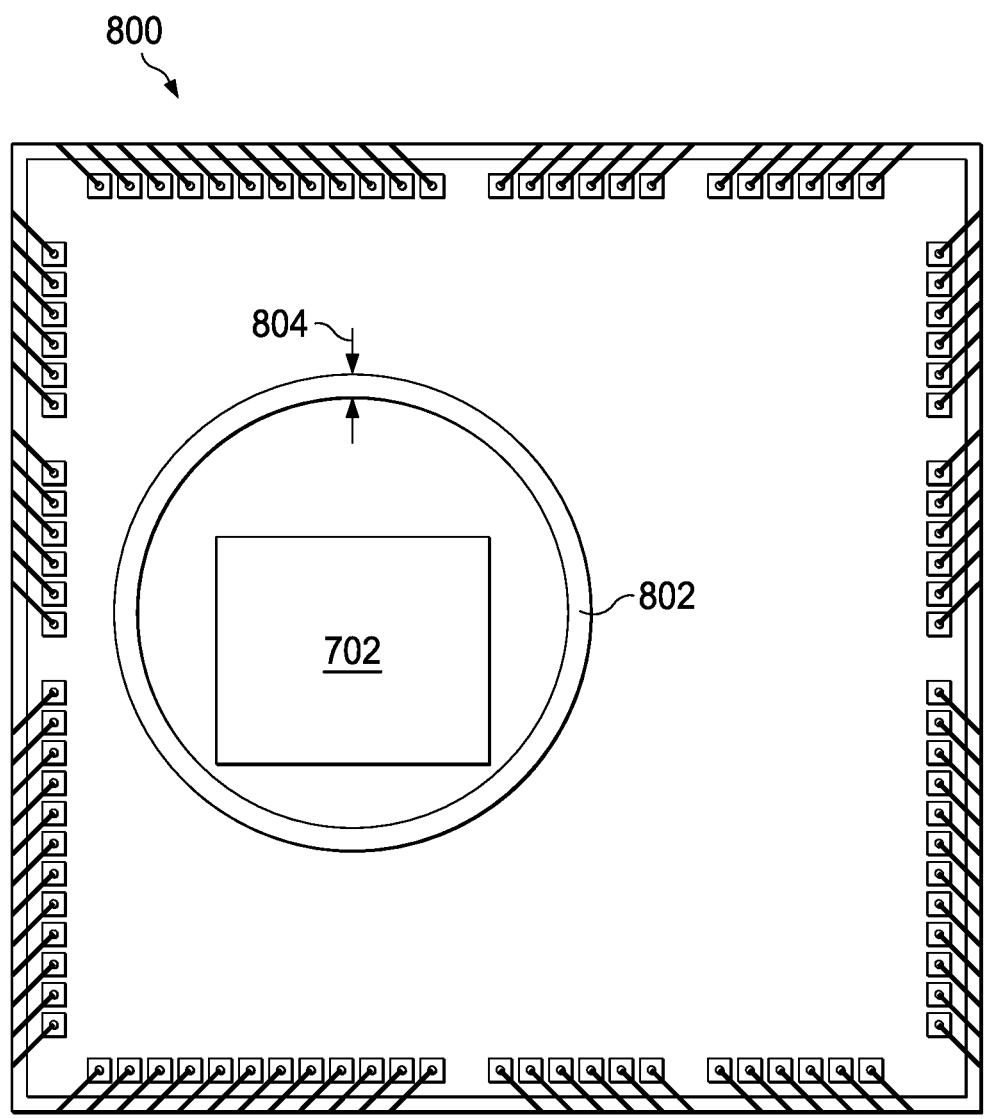
FIG. 8 is a top view of yet another example electronic package disclosed herein.

FIG. 8 is a top view of another example electronic package 800 disclosed herein. The electronic package 800 of the illustrated example is substantially similar to the electronic package 700 except the electronic package 800 includes a containment ring 802 (e.g., only one containment ring). The containment ring 802 of the illustrated example has a dimensional thickness 804 (e.g., defined by an inner radius and an outer radius) that is greater than a dimensional thickness of the first containment ring 704 (e.g., defined by an inner radius and an outer radius of the first containment ring 704) and/or a dimensional thickness of the second containment ring 706 of FIG. 7 (e.g., defined by an inner radius and an outer radius of the second containment ring 706). For example, the gap 708 of the example electronic package 700 of FIG. 7 is not formed with the example electronic package 800.

Figure 9:
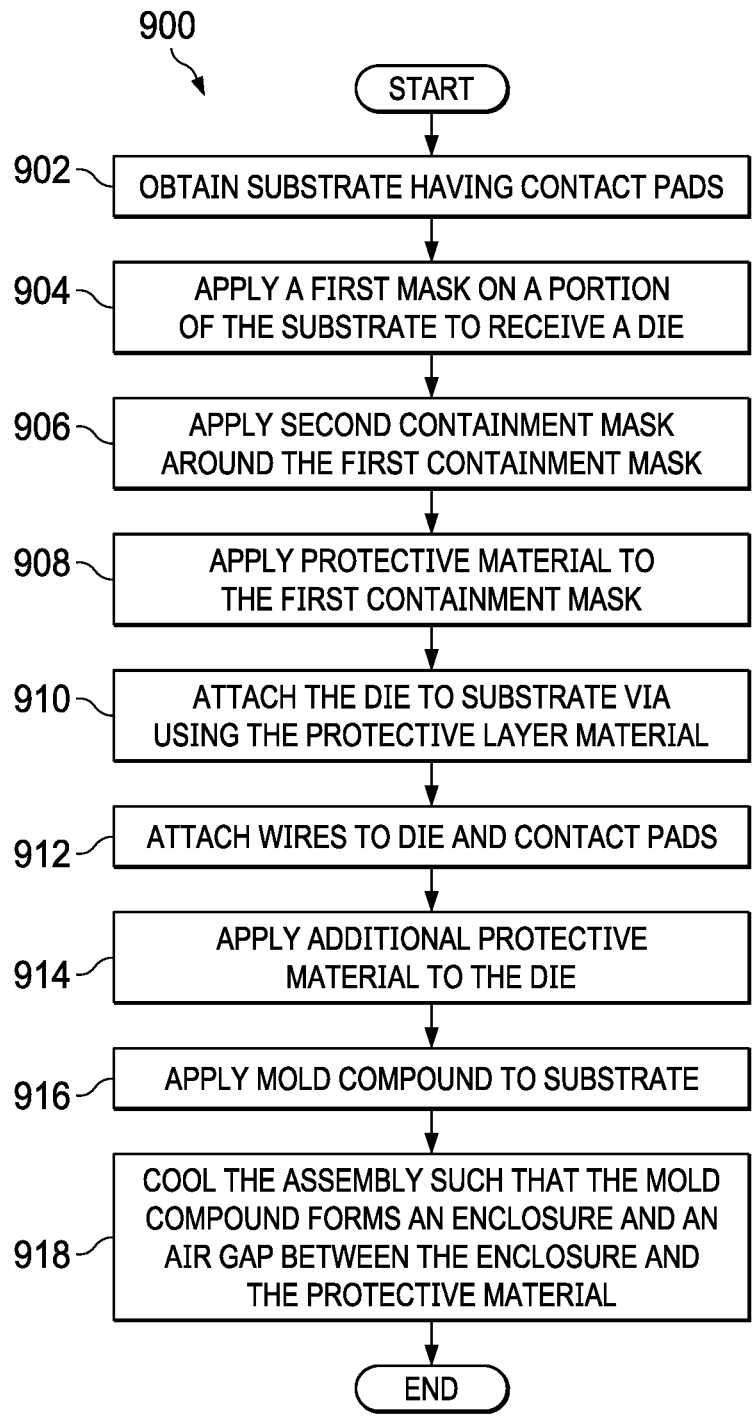
FIG. 9 is a flowchart of an example method of manufacturing an example electronic package disclosed herein.

FIG. 9 is a flowchart of an example method or process of fabricating an example electronic package disclosed herein. For example, the method 900 of FIG. 9 may be used to fabricate or form the example electronic package 100 of FIG. 1, the example electronic package 200 of FIGS. 2A and 2B, the example electronic package 300 of FIGS. 3A and 3B, the electronic package 400 of FIG. 4, the electronic package 500 of FIG. 5, the electronic package 600 of FIG. 6, the electronic package 700 of FIG. 7, and/or the electronic package 800 of FIG. 8.

To facilitate discussion of the example method 900, the example method 900 will be described in connection with the example electronic package 200 of FIGS. 2A and 2B. FIGS. 10-15 are cross-sectional schematic illustrations of the example electronic package 200 of FIGS. 2A and 2B at various manufacturing stages 1000-1500 corresponding to the example method 900 of FIG. 9.

While an example manner of forming the example electronic package 200 has been illustrated in FIGS. 9-15, one of the steps and/or processes illustrated in FIGS. 9-15 may be combined, divided, re-arranged, omitted, eliminated and/or implemented in any other way. Further still, the example methods of FIGS. 9-15 may include processes and/or steps in addition to, or instead of, those illustrated in FIGS. 9-15 and/or may include more than one of any or all of the illustrated processes and/or steps. Further, although the example methods are described with reference to the flowcharts illustrated in FIGS. 9-15, many other methods or processes of forming electronic packages may alternatively be used.

Referring to the example method 900 of FIG. 9, the method 900 begins by obtaining a substrate having contact pads (block 902). For example, obtaining the substrate 202 having conductive pads 214 may be performed by etching and/or any other semiconductor manufacturing process. In some examples, the substrate 202 is formed concurrently with the formation of the example electronic package 200. In some examples, the substrate 202 may be a wafer (e.g., a silicon wafer substrate) formed via conventional etching techniques and/or manufacturing processes.

Figure 10:
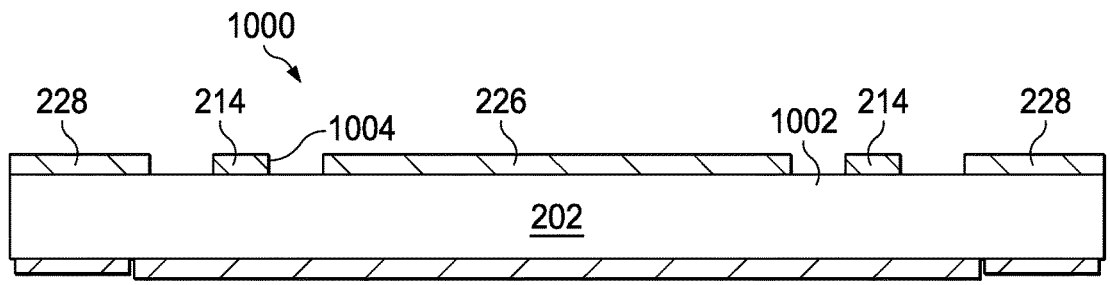
FIGS. 10-15 depict a series of figures showing the example electronic package of FIGS. 2A and 2B at various manufacturing stages corresponding to the example method of FIG. 9.
Figure 11:
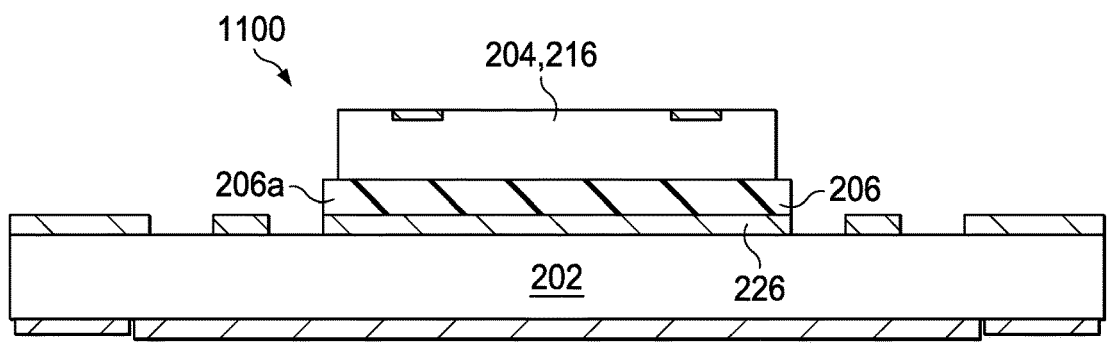
Figure 12:
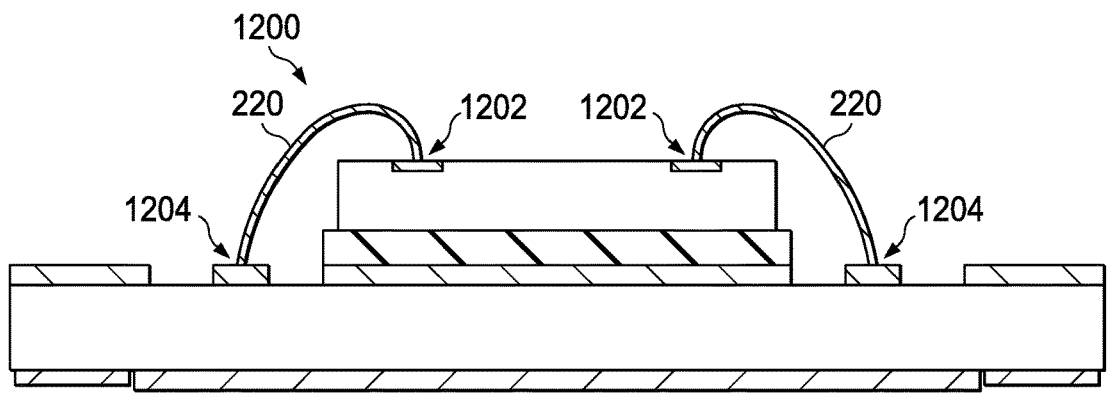

For example, referring to FIG. 10, the example substrate 202 may be obtained or formed via semiconductor or microfabrication (MEMS) manufacturing processes or technique(s). The substrate 202 of the illustrated example includes a base layer 1002. The base layer 1002 of the illustrated example may be composed of, for example, silicon (Si), gallium arsenide, germanium, quartz, ceramics such as alumina, aluminum, nitride low temperature cofired ceramics (LTCC) and high temperature cofired ceramics (HTCC), metals or glasses, etc. In some examples, the base layer 1002 may be a silicon wafer.

To form the conductive pads 214, in some examples, a conductive layer 1004 may be deposited on the base layer 1002. The conductive layer 1004 may be, for example, copper, aluminum and/or any other conductive material. The conductive pads 214 may be formed or patterned via etching or any other manufacturing processes. For example, to provide a pattern for etching, a photoresist layer may be applied on the base layer 1002. The photoresist layer may be applied to the base layer 1002 via, for example, spin coating, electroplating, spray coating, a laminated dry-film process or patterned plated, etc. The photoresist layer may be any material sensitive to ultra-violet light (wavelengths in the ultraviolet spectrum or shorter (<400 nm)). In some examples, photoresist layer is a photo-patternable polymer. Thus, the photoresist layer representative of a dimensional characteristic(s) of the conductive pads 214 is masked prior to etching the conductive pads 214. After the conductive pads 214 are formed (e.g., etched), the photoresist layer covering the conductive pads 214 is removed (e.g., stripped via a wafer cleaning procedure (e.g., a resist stripping procedure)).

A first containment mask is applied on an area of the substrate that is to receive an electronic component (block 904). For example, referring to FIG. 10, the first containment mask 226 is applied on the substrate 202 (e.g., after formation of the conductive pads 214) on an area of the substrate 202 that is to receive the electronic component 204. In some examples, the first containment mask 226 defines an area of the die 216 to be coupled to the substrate 202.

A second containment mask or ring is then applied to the substrate to encircle the area that is to receive the electronic component (block 906). For example, referring to FIG. 10, the second containment mask 228 is applied about or around a perimeter of the first containment mask 226. In particular, the second containment mask 228 completely surrounds the first containment mask 226 and the area of the substrate 202 that is to receive the die 216. Additionally, the second containment mask 228 of the illustrated example is positioned around the conductive pads 214 of the substrate 202. In some examples, the second containment mask 228 may be formed as a containment ring such as, for example, the containment rings 418, 704, 706, 802 and/or the substrate 202 may be formed with a cavity to receive the protective material such as, for example, the cavity 504 of FIG. 5.

In some examples, the first containment mask (or ring) and/or the second containment mask (or ring) may be deposited on the substrate 202 via a material dispenser that may be implemented by a dispenser, a syringe, and/or a nozzle. For example, the first containment mask and/or the second containment mask may be applied to the substrate via photolithography manufacturing techniques. For example, the first and/or second containment mask may be formed by dispensing (e.g., via a nozzle) the material forming the containment mask onto the substrate via spin coating technique(s), defining a pattern of the containment masks using a photoresist technique(s), and forming the pattern of the first and/or second containment masks via etching technique(s). In some examples, the first containment mask and/or the second containment mask may be deposited on the substrate 202 via an inkjet printer, a 3D printer and/or a screen printer that applies and/or deposits the first containment mask or the second containment mask onto the substrate. For example, a first ink residue may provide the first containment mask 226 and/or a second ink residue may provide the second containment mask 228 via, for example, additive manufacturing processes (e.g., inkjet printing, 3D printing, etc.). However, in other examples, any other manufacturing process may be used.

A first layer of a protective material is then applied to the first containment mask (block 908). For example, referring to FIG. 11, the first layer 206a of the protective material 206 is applied to the first containment mask 226. For example, the first layer 206a of the protective material 206 may be dispensed on the first containment mask 226 via a dispenser, a syringe, a nozzle and/or any other manufacturing technique or processes. The first containment mask 226 contains the first layer 206a and/or prevents the first layer 206a of the protective material 206 from flowing (e.g., bleeding out) beyond an outer perimeter of the first containment mask 226 and/or an outer perimeter defined by the die 216. In this manner, the first containment mask 226 contains the protective material 206 (e.g., silicone) from spreading on the substrate 202 beyond an outer perimeter defined by the first containment mask 226.

In some examples, prior to attaching the first containment mask 226, the second containment mask 228 and/or the protective material 206, the substrate 202, the first containment mask 226 and/or the second containment mask 228 may be cleaned with a cleaning agent to remove any contaminants.

An electronic component is then attached to a substrate via the first layer of the protective material (block 910). For example, referring to FIG. 11, the die 216 is positioned on the first layer 206a of the protective material 206. The die 216 of the illustrated example is a stress sensitive device. However, in some examples, a non-stress sensitive device such as, for example, the second die 306 of FIGS. 3A and 3B, the interposer 404 of FIG. 4 and/or the interposer 502 of FIG. 5 may be employed.

After the electronic component is attached to the substrate, one or more wires are attached to the electronic component and the contact pads (block 912). For example, referring to FIG. 12, with the die 216 positioned on the first layer 206a of the protective material 206, a first end 1202 of the wires 220 are coupled or attached to the die 216 and a second end 1204 of the wires 220 are coupled or attached to the conductive pads 214 of the substrate 202. For example, the wires 220 of the illustrated example are coupled to the die 216 and the substrate 202 via wire bonding manufacturing processes or technique(s) such as, for example, thermocompression bonding technique(s), ultrasonic boding technique(s), and/or other wire bonding technique(s) or processes.

Figure 13:
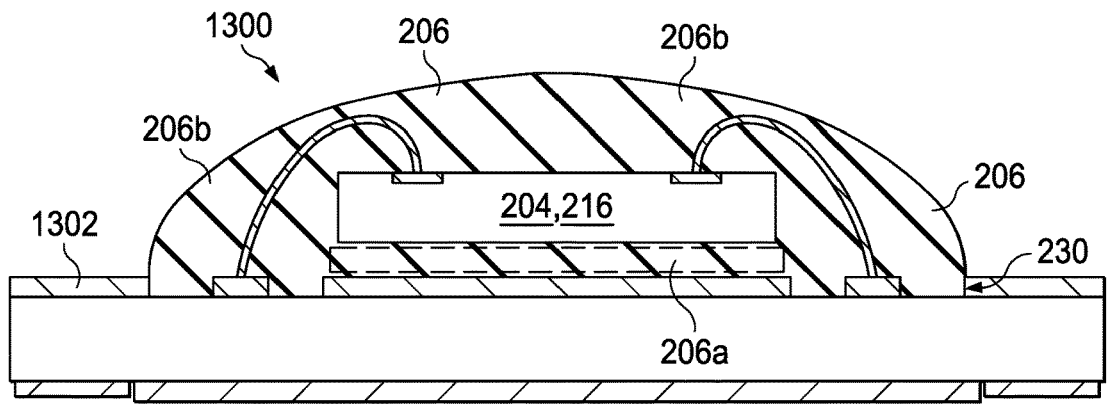
Figure 14:
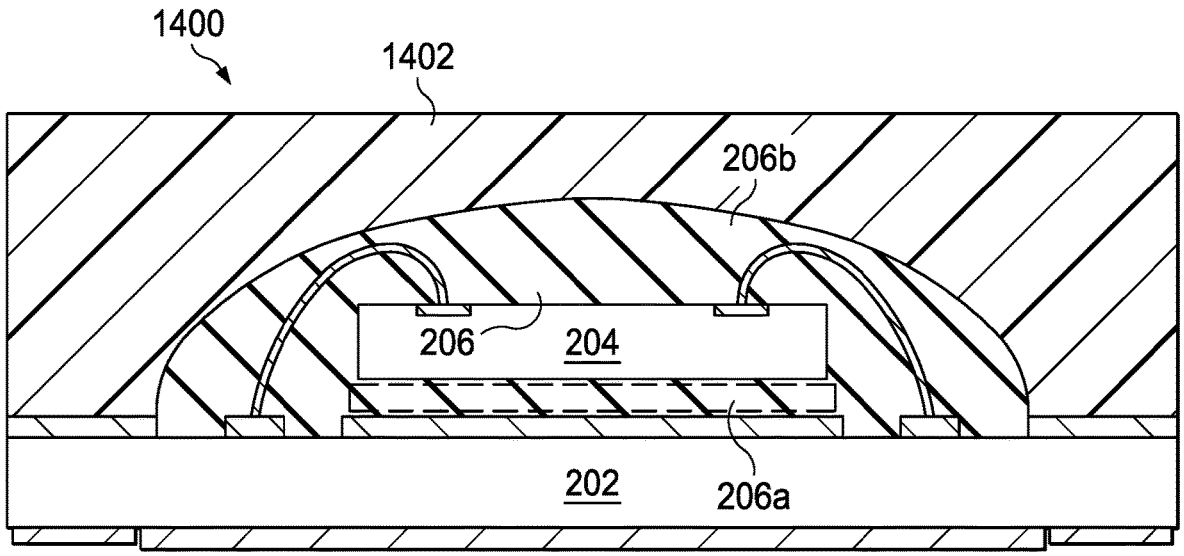

After bonding the wires, the protective material 206 is then applied to electronic component (block 914). Referring to FIG. 13, the second layer 206b of the protective material 206 is applied over the die 216. More specifically, the second layer 206b is applied on top and side surfaces of the electronic component 204 and/or die 216. In particular, the second layer 206b is dispensed in a pattern or configuration that, along with the rheological characteristics of the protective layer, enable the second layer 206b of the protective material 206 to retain a dome-like shape when the second layer 206b is applied to the die 216 and/or the substrate 202.

The second containment mask 228 of the illustrated example contains the second layer 206b of the protective material 206 and prevents the second layer 206b from flowing beyond the perimeter 230 defined by the second containment mask 228. In other words, the second layer 206b of the illustrated example flows up to the second containment mask 228. For example, the hydrophobic characteristics of the second containment mask 228 of the illustrated restricts (e.g. prevents) flow of the second layer 206b of the protective material 206 across a surface 1302 of the second containment mask 228. Thus, the second containment mask 228 provides a barrier or a stop to prevent the flow of the second layer 206b of the protective material 206 from flowing (bleeding out) past the perimeter 230 defined by the second containment mask 228. The second layer 206b of the protective material 206 also at least partially covers or otherwise encases the wires 220 and the conductive pads 214. Thus, as noted above, the first layer 206a and the second layer 206b fully surrounds the electronic component 204 or the die 216.

A mold compound is then applied to the substrate (block 916). For example, referring to FIG. 14 a mold compound 1402 is applied over the substrate 202 and the protective material 206 to form the enclosure 208. The mold compound may be applied via injection molding and/or other semiconductor manufacturing processes. When the mold compound 1402 is provided over the protective material 206, the heat or temperature of the mold compound 1402 (e.g., melted or liquid resin) causes the protective material 206 to expand such that a dimensional envelope of (e.g., at least the second layer 206b of) the protective material 206 increases as the mold compound 1402 is disposed over the protective material 206. For example, the mold compound 1402 may be at least 150 degrees Celsius (e.g., 180 degrees Celsius) when applied to the protective material 206 and the substrate 202. For example, the heat from the mold compound 1402 causes the protective material 206 to expand during manufacturing. In some examples, the protective material 206 may be heated to expand prior to the application of the mold compound 1402.

Figure 15:
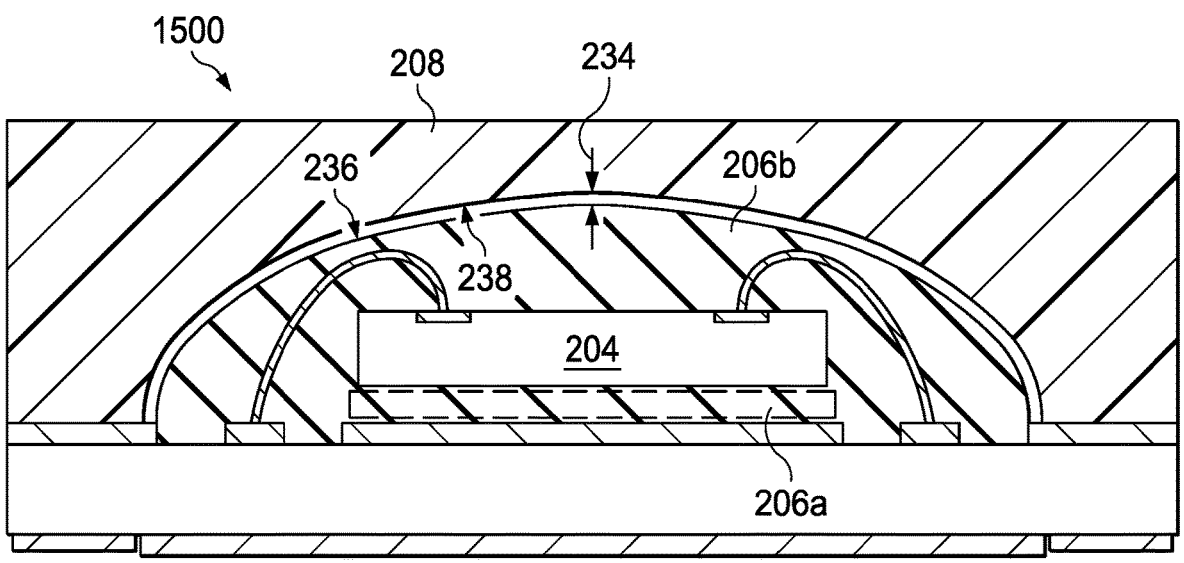

The mold compound is then cooled to solidify and form the enclosure and an air gap between the enclosure and the protective material (block 918). Referring to FIG. 15, the enclosure 208 covers the electronic component 204. Additionally, the air gap 234 is formed between the outer surface 236 of the protective material 206 and the inner surface 238 of the enclosure 208. The air gap 234 is formed because the protective material 206 cools at a faster rate than the cooling rate of the mold compound 1402 used to form the enclosure 208. For example, the protective material 206 may be silicone material (e.g., rubber) having a thermal rate of expansion of 300 parts per million per degree Celsius and the mold compound 1402 may be a plastic resin having a thermal rate of expansion of 20 parts per million per degree Celsius. Thus, as the mold compound 1402 (e.g., the enclosure 208) and the protective material 206 cool to room temperature, the protective material 206 shrinks at a greater rate than the mold compound 1402 forming the enclosure 208, thereby causing formation of the air gap 234. For example, (e.g., at least the second layer 206b of) the protective material 206 shrinks at a faster rate than the mold compound 1402 when cooling the mold compound 1402 that causes the air gap 234 to form between the second layer 206b of protective material 206 and the enclosure 208. Further, the protective material 206 does not stick or adhere to the enclosure 208 or the mold compound 1402 during cooling, and separates itself from the inner surface 238 of the enclosure 208.

As noted above, the protective material 206 and/or the air gap 234 reduce and/or isolate stresses on the electronic component 204. For example, the protective material 206 may have rubber type characteristics to dissipate and/or otherwise absorb forces to prevent the forces from reaching the electronic component 204. Additionally, the air gap 234 may isolate and/or decouple (e.g., mechanically decouple) the electronic component 204 from the enclosure 208. In this manner, the protective material 206 and/or the air gap 234 may substantially isolate the electronic component 204 from mechanical stresses and/or thermal stresses imparted to the enclosure 208. As a result, the protective material 206 and/or the air gap 234 provide a substantially zero package induced stresses on all surfaces of the electronic component 204 to significantly improve overall performance of the electronic component 204 and/or the electronic package 100. For example, the electronic package 200 of the illustrated example may provide die voltage control of approximately less than 1 part per million (e.g., less than 1 ppm) when the electronic device is operating at 2.5 Ghz, MEMS frequency control of less than approximately 20 parts per million (e.g., less than 20 ppm), and/or jitter control of less than 80 femtoseconds (fs). For example, currently, electronic devices cannot provide voltage control of less than 2 part per million.

The example method 900 and/or the example process of FIGS. 10-15 may be implemented with microfabrication and/or semiconductor manufacturing processes and technique(s). Some example processes include activities such as wafer handling, wafer sawing, die pick and place, die attach, ultrasonic wire bonding activities and/or package molding activities. For example, microfabrication, as described herein, relates to the process used for manufacture of nanometer and/or micrometer sized features on a variety of substrates using conventional microfabrication techniques. The process of microfabrication described herein may include a processes or a combination of processes such as, for example, photolithography, thermal inkjet manufacturing techniques, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of MEMS (microelectromechanical systems) or semiconductor devices.

In some examples, the flowchart of FIG. 9 and/or the example process of FIGS. 10-15 may be representative of example machine readable instructions for implementing a semiconductor manufacturing apparatus (e.g., equipment). In this example, the machine readable instructions comprise a program for execution by a processor such as the processor 1612 shown in the example processor platform 1600 discussed below in connection with FIG. 16. The program may be embodied in software stored on a non-transitory computer readable storage medium such as a CD-ROM, a floppy disk, a hard drive, a digital versatile disk (DVD), a Blu-ray disk, or a memory associated with the processor 1612, but the entire program and/or parts thereof could alternatively be executed by a device other than the processor 1612 and/or embodied in firmware or dedicated hardware. Further, although the example program is described with reference to the flowchart illustrated in FIG. 9, many other methods of implementing an example semiconductor manufacturing apparatus may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIG. 9 and/or the example process of FIGS. 10-15 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

Figure 16:
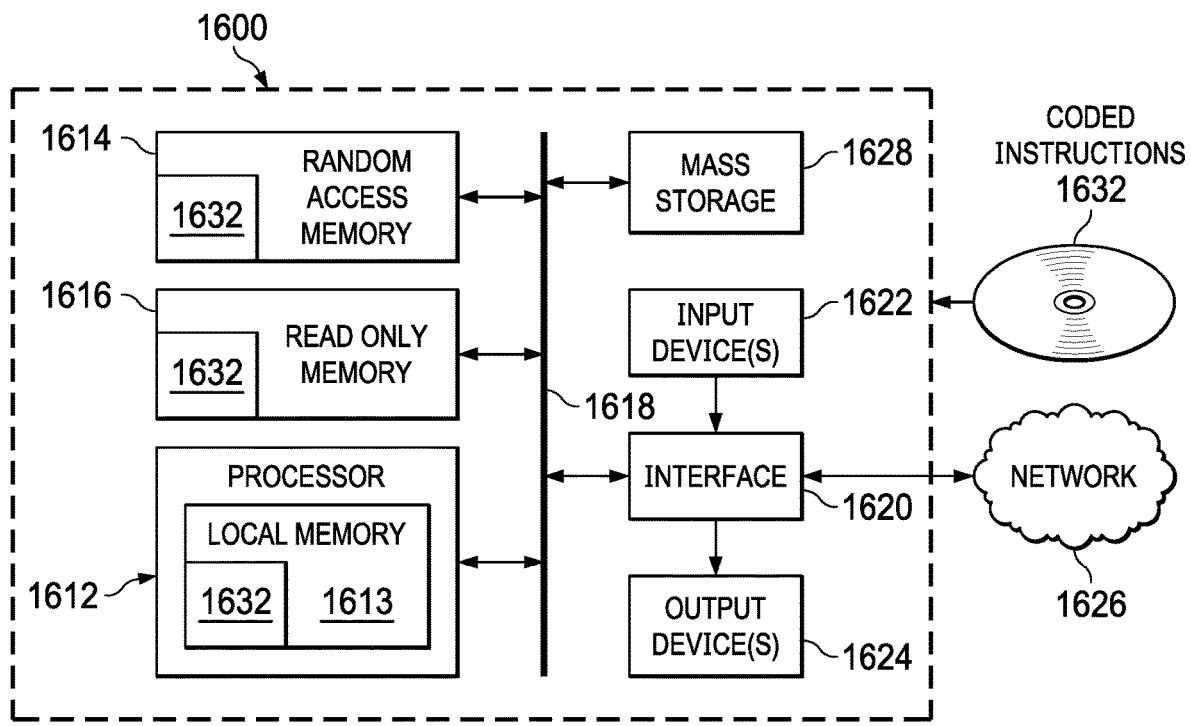
FIG. 16 is a block diagram of an example machine that may be used to implement the example methods and apparatus described herein.

FIG. 16 is a block diagram of an example processor platform 1600 capable of executing instructions for controlling a machine capable of performing the above-noted microfabrication processes and/or technique(s) that may be used to implement the example method 900 of FIG. 9 and/or the example process of FIGS. 10-15. For example, the method 900 and/or the process of FIGS. 10-15 may be implemented to control a machine (e.g., semiconductor manufacturing equipment or machines) via coded instructions 1632. The processor platform 1600 can be, for example, a server, a personal computer, a mobile device (e.g., a cell phone, a smart phone, a tablet such as an iPad™), a personal digital assistant (PDA), an Internet appliance, or any other type of computing device.

The processor platform 1600 of the illustrated example includes a processor 1612. The processor 1612 of the illustrated example is hardware. For example, the processor 1612 can be implemented by one or more integrated circuits, logic circuits, microprocessors or controllers from any desired family or manufacturer. The hardware processor may be a semiconductor based (e.g., silicon based) device.

The processor 1612 of the illustrated example includes a local memory 1613 (e.g., a cache). The processor 1612 of the illustrated example is in communication with a main memory including a volatile memory 1614 and a non-volatile memory 1616 via a bus 1618. The volatile memory 1614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1616 may be implemented by flash memory and/or any other desired type of memory device. Access to the main memory 1614, 1616 is controlled by a memory controller.

The processor platform 1600 of the illustrated example also includes an interface circuit 1620. The interface circuit 1620 may be implemented by any type of interface standard, such as an Ethernet interface, a universal serial bus (USB), and/or a PCI express interface.

In the illustrated example, one or more input devices 1622 are connected to the interface circuit 1620. The input device(s) 1622 permit(s) a user to enter data and/or commands into the processor 1612. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1624 are also connected to the interface circuit 1620 of the illustrated example. The output devices 1624 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1620 of the illustrated example, thus, typically includes a graphics driver card, a graphics driver chip and/or a graphics driver processor.

The interface circuit 1620 of the illustrated example also includes a communication device such as a transmitter, a receiver, a transceiver, a modem and/or network interface card to facilitate exchange of data with external machines (e.g., computing devices of any kind) via a network 1626 (e.g., an Ethernet connection, a digital subscriber line (DSL), a telephone line, coaxial cable, a cellular telephone system, etc.).

The processor platform 1600 of the illustrated example also includes one or more mass storage devices 1628 for storing software and/or data. Examples of such mass storage devices 1628 include floppy disk drives, hard drive disks, compact disk drives, Blu-ray disk drives, RAID systems, and digital versatile disk (DVD) drives.

The coded instructions 1632 of FIG. 9 may be stored in the mass storage device 1628, in the volatile memory 1614, in the non-volatile memory 1616, and/or on a removable tangible computer readable storage medium such as a CD or DVD.

Example electronic packages and related methods are disclosed. Further examples and combinations thereof include, but are not limited to, the following:

Example 1 includes an example electronic package apparatus having a substrate and an electronic component. A protective material is positioned on a first surface, a second surface and all side surfaces of the electronic component to encase the electronic component. An enclosure is coupled to the substrate to cover the protective material and the electronic component.

Example 2 includes the subject matter of example 1, wherein the enclosure includes a cavity to receive the protective material, wherein the enclosure and the protective material form an air gap between an inner surface of the cavity and an outer surface of the protective material Example 3 includes the subject matter of any one of examples 1-2, wherein at least one of the protective material or the air gap isolates the electronic component from the enclosure Example 4 includes the subject matter of any one of examples 1-3, wherein the air gap decouples the enclosure and the electronic component.

Example 5 includes the subject matter of any one of examples 1-4, wherein the protective material is silicone.

Example 6 includes the subject matter of any one of examples 1-5, wherein the protective material has Young's modulus of elasticity of between approximately 2 megapascal (MPa) and 6 megapascal (MPa).

Example 7 includes the subject matter of any one of examples 1-6, wherein the protective material surrounds the first surface, the second surface and all side surfaces of the electronic surfaces.

Example 8 includes the subject matter of any one of examples 1-7, further including electrical wires to electrically couple electrical pads of the electronic component and electrical pads of the substrate, the protective material is to cover the wires, the electrical pads of the electronic component and the electrical pads of the substrate.

Example 9 includes the subject matter of any one of examples 1-8, further including a first containment mask positioned on a portion of the substrate to receive the electronic component.

Example 10 includes the subject matter of any one of examples 1-9, further including a second containment mask positioned on the substrate, the second containment mask to surround the electronic component.

Example 11 includes a method including dispensing a first containment mask on an area of a substrate that is to receive an electronic component; dispensing a second containment mask on the substrate, the second containment mask to surround the first containment mask; applying a first layer of a protective material on the first containment mask, the first containment mask to prevent the first layer of the protective material from flowing outside a perimeter defined by the first containment mask; positioning the electronic component on the first layer of the protective material; and applying a second layer of a protective material on the electronic component, the second containment mask to prevent the second layer of the protective material from flowing outside a perimeter defined by the second containment mask Example 12 includes the subject matter of example 11, further comprising applying a mold compound to the substrate.

Example 13 includes the subject matter of any one of examples 10-12, further comprising heating the mold compound to a temperature of at least 150 degrees Celsius when applying the mold compound to the substrate to cause a dimensional envelope of at least the second layer of the protective material to increase when applying the mold compound to the substrate.

Example 14 includes the subject matter of any one of examples 10-13, further comprising cooling the mold compound to cause the mold compound to form an enclosure, and wherein the at least the second layer of the protective material is to shrink at a faster rate than the mold compound when cooling the mold compound to form an air gap between the second layer of protective material and the enclosure.

Example 15 includes the subject matter of any one of examples 10-14, further including forming the substrate with contact pads prior to applying the first containment mask and the second containment mask to the substrate.

Example 16 includes the subject matter of any one of examples 10-15, wherein the dispensing of the first containment mask or the dispensing of the second containment mask is provided via an inject printer.

Example 17 includes an example electronic package apparatus including a first ink residue to provide a first containment mask positioned on a portion of the substrate and a second ink residue to provide a second containment mask positioned on a second portion of the substrate different than the first portion. A first layer of a protective material positioned on the first containment mask. A die positioned on the first layer of the protective material such that the first layer of protective material is between the first containment mask and a first surface of the die oriented toward the substrate. The die to be electrically coupled to a pad of the substrate. A second layer of the protective material positioned covering portions of the die. The first layer of the protective material and the second layer of the protective material to encapsulate the die. The second containment mask to contain the second layer of protective material within a perimeter defined by the second containment mask. An enclosure is coupled to the substrate.

Example 18 includes the subject matter of example 17, wherein the enclosure and the second layer of the protective material form an air gap between an inner surface of the enclosure and an outer surface of the second layer of the protective material.

Example 19 includes the subject matter of any one of examples 17-18, wherein the protective material is at least one of a rubber material or a silicone.

Example 20 includes the subject matter of any one of examples 17-19, further including an electronic component coupled to the die via a die attach material.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An electronic package comprising:
   a substrate;
   a first die electrically connected to the substrate;
   a bulk acoustic wave (BAW) device attached to, and electrically connected to, the first die;
   a protective material covering portions of a top surface of the first die, a top surface of the BAW device, and covering an entire area of a bottom surface of the first die, the bottom surface proximate to the substrate than the top surface;
   a cavity filled with air covering portions of the protective material; and
   an enclosure covering portions of the cavity.

2. The electronic package of claim 1 wherein the BAW device is electrically connected to the first die via a bond wire.

3. The electronic package of claim 1, wherein the BAW device is sensitive to stress from the electronic package.

4. The electronic package of claim 1 further including containment mask contacting the substrate, wherein the cavity filled with air contacts a portion of the containment mask.

5. The electronic package of claim 4, wherein the containment mask includes hydrophobic characteristics.

6. The electronic package of claim 4, wherein the containment mask includes adhesive characteristic.

7. The electronic package of claim 4, wherein the containment mask includes one of an epoxy based polymer material, a polyimide, a polyamide, a bismaleimide (BMI) resin, a polyamide-imide polymer, a hydrophobic polyimide, and a hydrophobic coating.

8. The electronic package of claim 1, wherein the protective material is silicone.

9. The electronic package of claim 1, wherein the protective material has Young's modulus of elasticity of between approximately 2 megapascal (MPa) and 6 megapascal (MPa).

10. The electronic package of claim 1, wherein the BAW device is attached to the first die via a die attach material.

11. The electronic package of claim 1, wherein the substrate includes electrical conductive pads.

12. The electronic package of claim 11, wherein the electrical conductive pads include copper.

13. The electronic package of claim 1, wherein the substrate includes a printed circuit board.

14. The electronic package of claim 1, wherein the substrate includes Silicon.

* * * * *